(12) United States Patent
Yamazaki et al.

(10) Patent No.: US 10,895,478 B2
(45) Date of Patent: Jan. 19, 2021

(54) SENSOR UNIT

(71) Applicant: Keyence Corporation, Osaka (JP)

(72) Inventors: Kentaro Yamazaki, Osaka (JP); Tsuyoshi Tagashira, Osaka (JP)

(73) Assignee: KEYENCE CORPORATION, Osaka (JP)

(*) Notice: Subject to any disclaimer, the term of this patent is extended or adjusted under 35 U.S.C. 154(b) by 110 days.

(21) Appl. No.: 16/100,247

(22) Filed: Aug. 10, 2018

(65) Prior Publication Data

US 2019/0097629 A1 Mar. 28, 2019

(30) Foreign Application Priority Data

Sep. 27, 2017 (JP) .................................. 2017-186814

(51) Int. Cl.
*G01D 7/00* (2006.01)
*G01V 8/12* (2006.01)
(Continued)

(52) U.S. Cl.
CPC ............. *G01D 7/00* (2013.01); *G01R 13/405* (2013.01); *G01V 8/12* (2013.01); *G01V 8/20* (2013.01); *H03K 17/941* (2013.01); *G06F 3/0482* (2013.01); *G06F 3/0488* (2013.01); *H03K 2217/94021* (2013.01)

(58) Field of Classification Search
CPC ................. H03K 17/941; H03K 17/78; H03K 2217/94021; G01V 8/12; G01V 8/20; G01V 8/16; G01R 13/405; G01D 7/00; G06F 3/0488–04886; G06F 3/0482
See application file for complete search history.

(56) References Cited

U.S. PATENT DOCUMENTS

| | | | |
|---|---|---|---|
| 9,841,808 B2 | 12/2017 | Hanada | |
| 2015/0109308 A1* | 4/2015 | Hanada | ............... G01B 11/14 345/472 |
| 2018/0059772 A1 | 3/2018 | Hanada | |

FOREIGN PATENT DOCUMENTS

| | | |
|---|---|---|
| JP | 2005-210720 A | 8/2005 |
| JP | 2015-081869 A | 4/2015 |
| JP | 2015-081870 A | 4/2015 |

OTHER PUBLICATIONS

U.S. Appl. No. 16/100,243, filed Aug. 10, 2018 (62 pages).
(Continued)

*Primary Examiner* — David Tung
(74) *Attorney, Agent, or Firm* — Kilyk & Bowersox, P.L.L.C.

(57) ABSTRACT

To provide a sensor unit that simultaneously displays other information together with a threshold and a physical quantity. A sensor unit causes a dot-matrix display unit to display a threshold and a physical quantity in a first display form and causes the dot-matrix display unit to display, together with the physical quantity and the threshold, additional information (e.g., a power mode) different from the physical quantity and different from the threshold in a second display form. The area of a third display region 303 for the threshold in the second display form is smaller than the area of a second display region 302 for the threshold in the first display form. The area of a fourth display region 304 for the information in the second display form is obtained by reducing the area of the second display region 302.

20 Claims, 21 Drawing Sheets

(51) Int. Cl.
    *H03K 17/94*         (2006.01)
    *G01R 13/40*         (2006.01)
    *G01V 8/20*          (2006.01)
    *G06F 3/0482*       (2013.01)
    *G06F 3/0488*       (2013.01)
    *G01V 8/16*          (2006.01)
    *H03K 17/78*         (2006.01)

(56) References Cited

OTHER PUBLICATIONS

U.S. Appl. No. 16/100,244, filed Aug. 10, 2018 (61 pages).
U.S. Appl. No. 16/100,248, filed Aug. 10, 2018 (75 pages).
U.S. Appl. No. 15/928,518, filed Mar. 22, 2018 (97 pages).
U.S. Appl. No. 15/928,499, filed Mar. 22, 2018 (59 pages).

\* cited by examiner

SENSOR UNIT

CROSS-REFERENCE TO RELATED APPLICATIONS

The present application claims foreign priority based on Japanese Patent Application No. 2017-186814, filed Sep. 27, 2017, the contents of which is incorporated herein by reference.

BACKGROUND OF THE INVENTION

1. Field of the Invention

The present invention relates to a sensor unit such as a photoelectric switch.

2. Description of Related Art

A product (work) produced in a factory is conveyed by a conveying apparatus such as a belt conveyor. Arrival of the work at a predetermined place is detected by a photoelectric switch. The photoelectric switch includes a light projecting element and a light receiving element. The light receiving element receives light projected from the light projecting element. The photoelectric switch determines presence or absence of the work according to whether a light receiving amount exceeds a threshold. Therefore, the photoelectric switch includes a seven-segment LED display configured to display the light receiving amount and the threshold (JP-A-2005-210720 (Patent Literature 1)).

JP-A-2015-81869 (Patent Literature 2) and JP-A-2015-81870 (Patent Literature 3) propose that a dot matrix display be adopted as a display of a photoelectric switch.

As described in Patent Literature 1, a seven-segment LED has been a mainstream in a slim-type sensor unit. As described in Patent Literatures 2 and 3, a display of a dot matric type has been adoptable in a large sensor unit. If the display of the dot matrix type can be adopted in the slim-type sensor unit as well, flexibility of display increases. A sensor unit simultaneously displays a threshold and a physical quantity such as a light receiving amount. However, it is sometimes desired that the sensor unit simultaneously displays additional information (e.g., information indicating an operation mode) other than the threshold and the physical quantity.

SUMMARY OF THE INVENTION

Accordingly, an object of the present invention is to provide a sensor unit that simultaneously displays other information together with a threshold and a physical quantity.

The present invention provides, for example, a sensor unit including: a detecting unit configured to detect a physical quantity; a dot-matrix display unit configured to display the physical quantity detected by the detecting unit; an output unit configured to output a comparison result of the physical quantity detected by the detecting unit and a threshold; an operation unit configured to receive adjustment operation for the threshold; and a control unit configured to control the dot-matrix display unit. The control unit is configured to cause the dot-matrix display unit to display the threshold and the physical quantity in a first display form and cause the dot-matrix display unit to display, together with the physical quantity and the threshold, information different from the physical quantity and different from the threshold in a second display form. An area of a display region for one of the threshold and the physical quantity in the second display form is smaller than an area of the display region for the one of the threshold and the physical quantity in the first display form. An area of a display region for the information in the second display form is obtained by reducing the area of the display region for the one of the threshold and the physical quantity.

According to the present invention, there is provided a sensor unit configured to simultaneously display other information together a threshold and a physical quantity.

DESCRIPTION OF EMBODIMENTS

An embodiment of the present invention is explained below. The individual embodiment explained below would be useful for understanding various concepts such as a superordinate concept, an intermediate concept, and a subordinate concept of the present invention. The technical scope of the present invention is decided by the claims and is not limited by the individual embodiment explained below.

Figure 1:
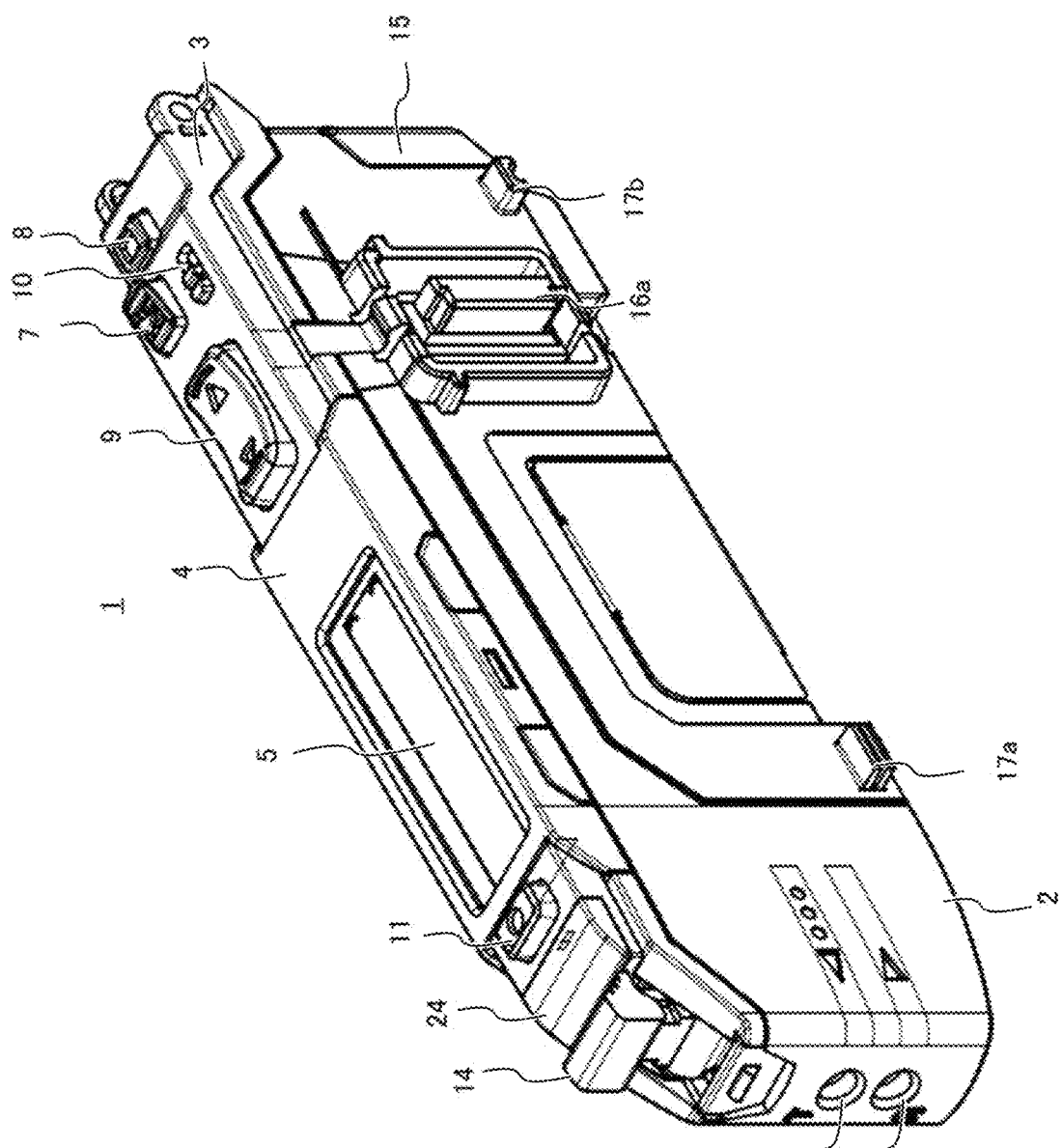
FIG. 1 is a perspective view showing a photoelectric switch.
Figure 1:
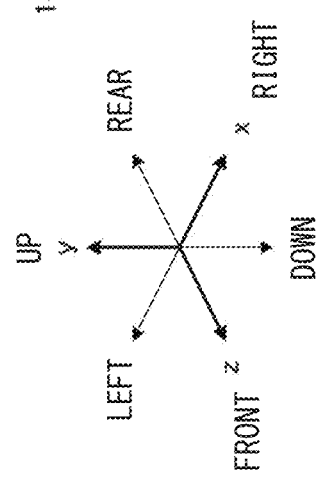

FIG. 1 is a perspective view showing a photoelectric switch. A photoelectric switch 1 includes a substantially rectangular housing. In FIG. 1, a z axis corresponds to a longitudinal direction, an x axis corresponds to a latitudinal direction, and a y axis corresponds to a height direction. The housing generally has six outer surfaces. The six outer surfaces include an upper surface, a bottom surface, a front surface, a rear surface, a left side surface, and a right side surface. In FIG. 1, the upper surface, the front surface, and the right side surface are seen. The housing includes a lower case 2 and an upper case 3. An internal space in which a control board and the like are housed is formed by fitting the lower case 2 and the upper case 3. A part of the upper case 3 forms the upper surface. A display 5, a mode button 8, an active receiver button 7, an adjustment button 9, a slide switch 10, a set button 11, a display lamp 24, a clamp module 14, and the like are provided on the upper surface. The display 5 is a dot matrix display such as an OLED and displays a threshold and a light receiving amount. The display 5 is held and fixed by the outer surface of the upper case 3 and a cover member 4. The display 5 is provided to be offset further to the front surface side than the center of the upper surface. The adjustment button 9 is a button for increasing and reducing a threshold and operating a menu. The menu is a menu displayed on the display 5 and including various setting items for setting the operation of the photoelectric switch 1. The mode button 8 is a button for switching an operation mode related to a light projection amount and the like. The active receiver button 7 is a special button for projecting light from the photoelectric switch 1 to the outside through a light receiving fiber. When detecting depression of the active receiver button 7, the photoelectric switch 1 uses the light receiving fiber as a light projecting fiber and projects light toward the outside while receiving light made incident from the outside. The projected light is not light for detecting work and is light for assisting optical axis adjustment by a user. Note that a light emitting element configured to output the assist light may be disposed in the center of a light receiving element. In this case, a light receiving surface of the light receiving element is larger than a light emitting surface of the light emitting element. The slide switch 10 is a switch for selecting a set of a plurality of setting parameters. The set button 11 is a button for starting automatic setting of a threshold. When detecting that the set button 11 is pressed, the photoelectric switch 1 determines a threshold according to a light receiving amount. For example, when the work is detected, the display lamp 24 is lit or extinguished. The clamp module 14 is a module configured to clamp and hold the light projecting fiber and the light receiving fiber. A tubular hole 12 into which the light projecting fiber is inserted and a tubular hole 13 into which the light receiving fiber is inserted are provided on the front surface of the housing. An output cable is attached to the rear surface of the housing. A cable bush 15 is a bush for holding the output cable.

Figure 2A:
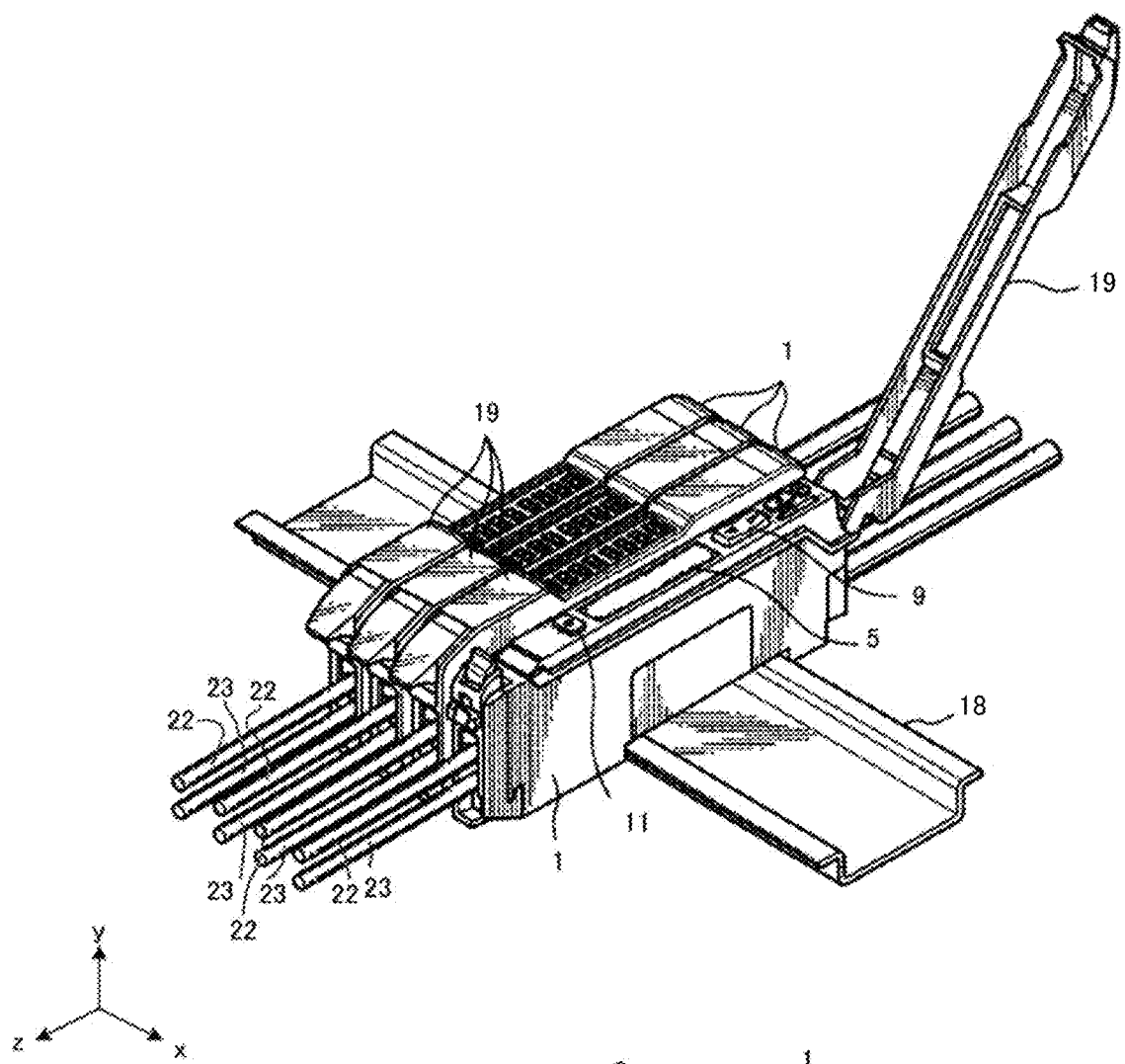
FIGS. 2A and 2B are perspective views showing a plurality of photoelectric switches coupled to one another.
Figure 2B:
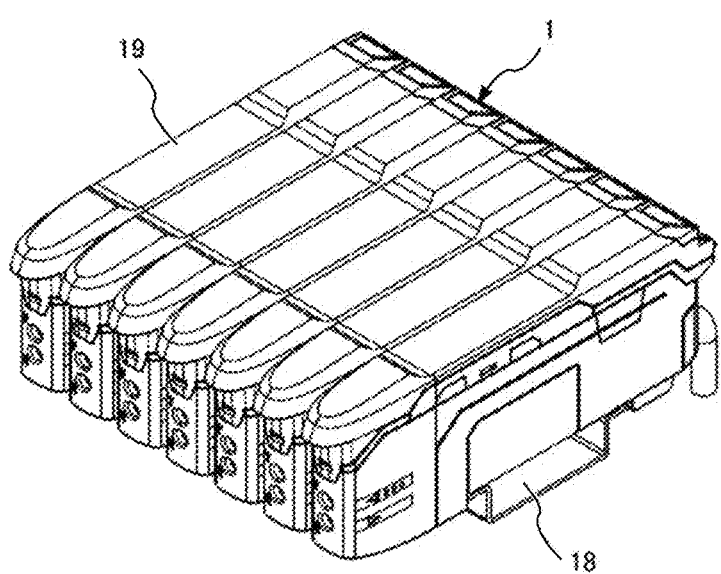

A connector 16a and coupling sections 17a and 17b are provided on the right side surface of the housing. FIGS. 2A and 2B show that a plurality of photoelectric switches 1 are respectively coupled to one another by the connectors 16a and the coupling sections 17a and 17b and fixed to a DIN rail 18. DIN is an abbreviation of Deutsches Institut für Normung. In FIG. 2A, four photoelectric switches 1 are coupled. In FIG. 2B, eight photoelectric switches 1a to 1g are coupled. Incident ends of light projecting fibers 22 of the photoelectric switches 1 are inserted into the holes 12. Emission ends of light receiving fibers 23 are inserted into the holes 13. In FIG. 2A, an open-closable upper cover 19 configured to cover the upper surface of the housing is also shown. Note that, as shown in FIG. 2B, when the upper cover 19 has light transmissivity, a hole may not be provided on the upper surface of the upper cover 19. This is because, if the upper cover 19 has light transmissivity, the user can confirm display content of the display 5 even in a closed state of the upper cover 19. When the upper cover 19 does not have light transmissivity, as shown in FIG. 2A, a hole or a window may be provided on the upper surface of the upper cover 19. The upper cover 19 functions as a dust cover. As shown in FIGS. 2A and 2B, the plurality of photoelectric switches 1 can be respectively laterally coupled. Therefore, the plurality of photoelectric switches 1 are called interconnected sensor as well.

Figure 3:
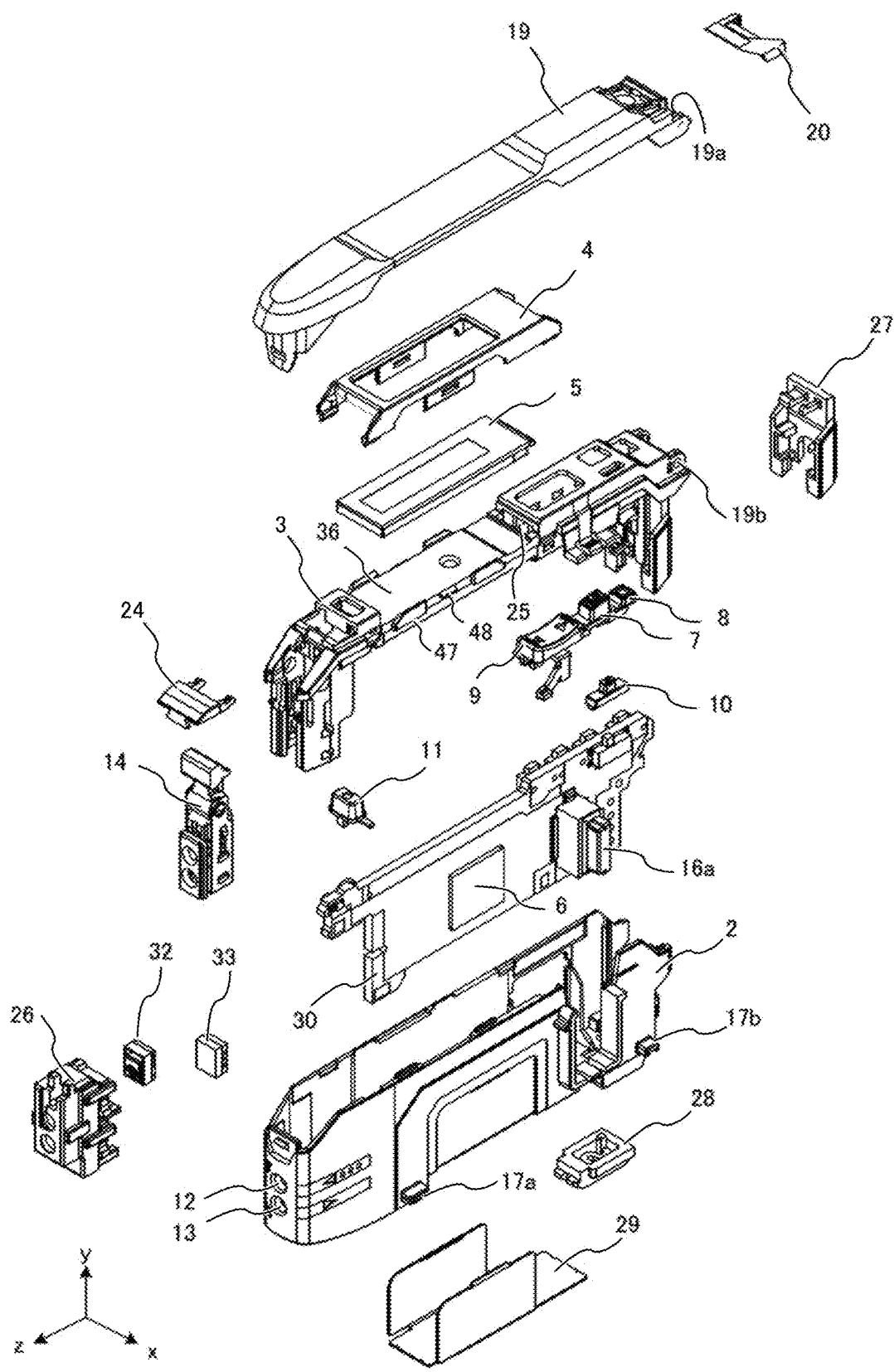
FIG. 3 is an exploded view showing the photoelectric switch.

FIG. 3 is an exploded view of the photoelectric switch 1. A decoration member 20 may be provided on the rear end side of the upper cover 19. A rotational pin 19a is provided on the rear end side of the upper cover 19. The rotational pin 19a fits in a holding hole 19b provided on the rear end side of the upper case 3. Consequently, the upper cover 19 is rotatably coupled to the upper case 3. To enable the user to confirm information displayed on the display 5 even in the closed state of the upper cover 19, the upper cover 19 may be formed by a transparent member. A backbone member 36 for supporting the display 5 is provided near the center of the upper case 3. Four fringes 47 are provided on the left and the right of the backbone member 36. The four fringes 47 are projecting sections projecting upward from the upper case 3. The four fringes 47 position the display 5 in the latitudinal direction (the x direction). Note that the four fringes 47 fit with recessed sections of the cover member 4. Two claw sections 48 are provided on the left and the right of the backbone member 36. The claw sections 48 fit with recessed sections provided on the inner side of a center leg of the cover member and fix the cover member 4 to the upper case 3. The recessed sections may be grooves or may be through-holes. An opening section 25 is provided on the rear end side of a display mounting section centering on the backbone member 36. The opening section 25 is a through-hole or a cutout for allowing a signal cable to pass from the outer surface to the inner surface side of the upper case 3. The signal cable includes a power supply line for supplying electric power to the display 5 and a control line for supplying a control signal to the display 5. The signal cable is connected to a control board 30. The control board 30 may be one substrate. If two substrates are provided in the x-axis direction, the length in the x-axis direction of the photoelectric switch 1 increases. Therefore, in this embodiment, only one control board 30 is provided in the x-axis direction. A controller 6 such as a CPU (central processing unit) is mounted on the control board 30. The controller 6 causes the display 5 to display a threshold and a light receiving amount. Switches corresponding to the adjustment button 9, the mode button 8, the active receiver button 7, the slide switch 10, and the set button 11 are mounted on the control board 30. The buttons may be formed of resin such as POM (polyacetal). Note that the upper cover 19, the cover member 4, and the housing may be basically formed of polycarbonate. An LED (light emitting diode) for supplying light to a light diffusing member of the display lamp 24 is also mounted on the control board 30. On the control board 30, the connector 16a for communicating with adjacent another photoelectric switch 1 and receiving electric power is provided. An element holder 26 is provided on the front surface side of the control board 30. A light emitting element module 32 and a light receiving element module 33 are attached to the element holder 26. The element holder 26 includes a hole for the light projecting fiber 22 inserted from the hole 12 and a hole for the light receiving fiber 23 inserted from the hole 13. The clamp module 14 is disposed on the front surface side of the element holder 26. The clamp module 14 holds the light projecting fiber 22 and the light receiving fiber 23. A fixture 28 for fixing to the DIN rail 18 and a metal cover 29 are attached to the bottom surface of the lower case 2. The metal cover 29 may play a role of heat radiation and an electromagnetic shield.

Figure 4A:
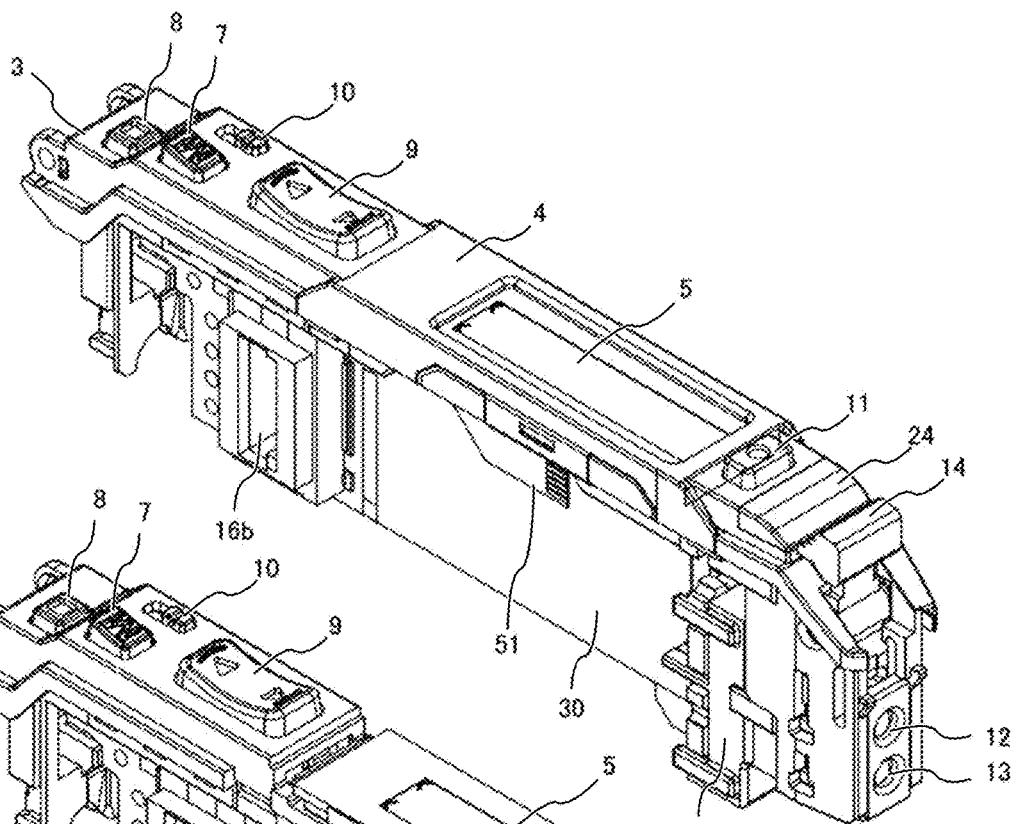
FIGS. 4A and 4B are perspective views showing the photoelectric switch.
Figure 4B:
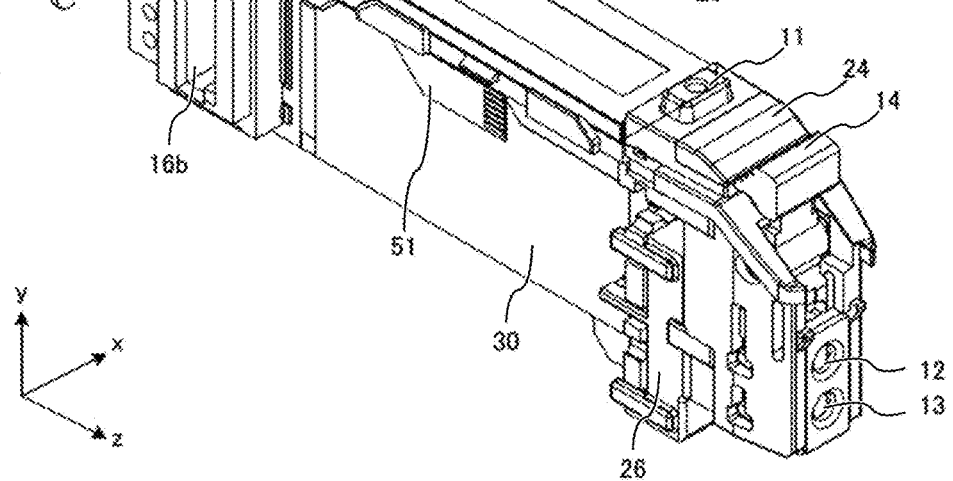

FIG. 4A is a perspective view of the photoelectric switch 1 in a state in which the cover member 4 is fixed to the upper case 3. FIG. 4B is a perspective view of the photoelectric switch 1 in a state in which the cover member 4 is not fixed to the upper case 3. Various buttons and the display 5 are fixed to the upper case 3. Further, the control board 30 is fixed to the upper case 3. A signal cable 51 electrically connected to the display 5 and the control board 30 enters the inside of the housing passing through the opening section 25. The signal cable 51 is connected to a connector of the control board 30. A connector 16b is provided on the left side surface of the control board 30. The connector 16b of the photoelectric switch 1 is a female connector. The connector 16b fits with and is electrically connected to the male connector 16a of another photoelectric switch 1 located on the left of the photoelectric switch 1.

Note that, as it is seen from FIG. 4A and the like, the height of the active receiver button 7 is smaller than the height of the mode button 8 and the adjustment button 9. This is to prevent wrong operation of the active receiver button 7.

Figure 5:
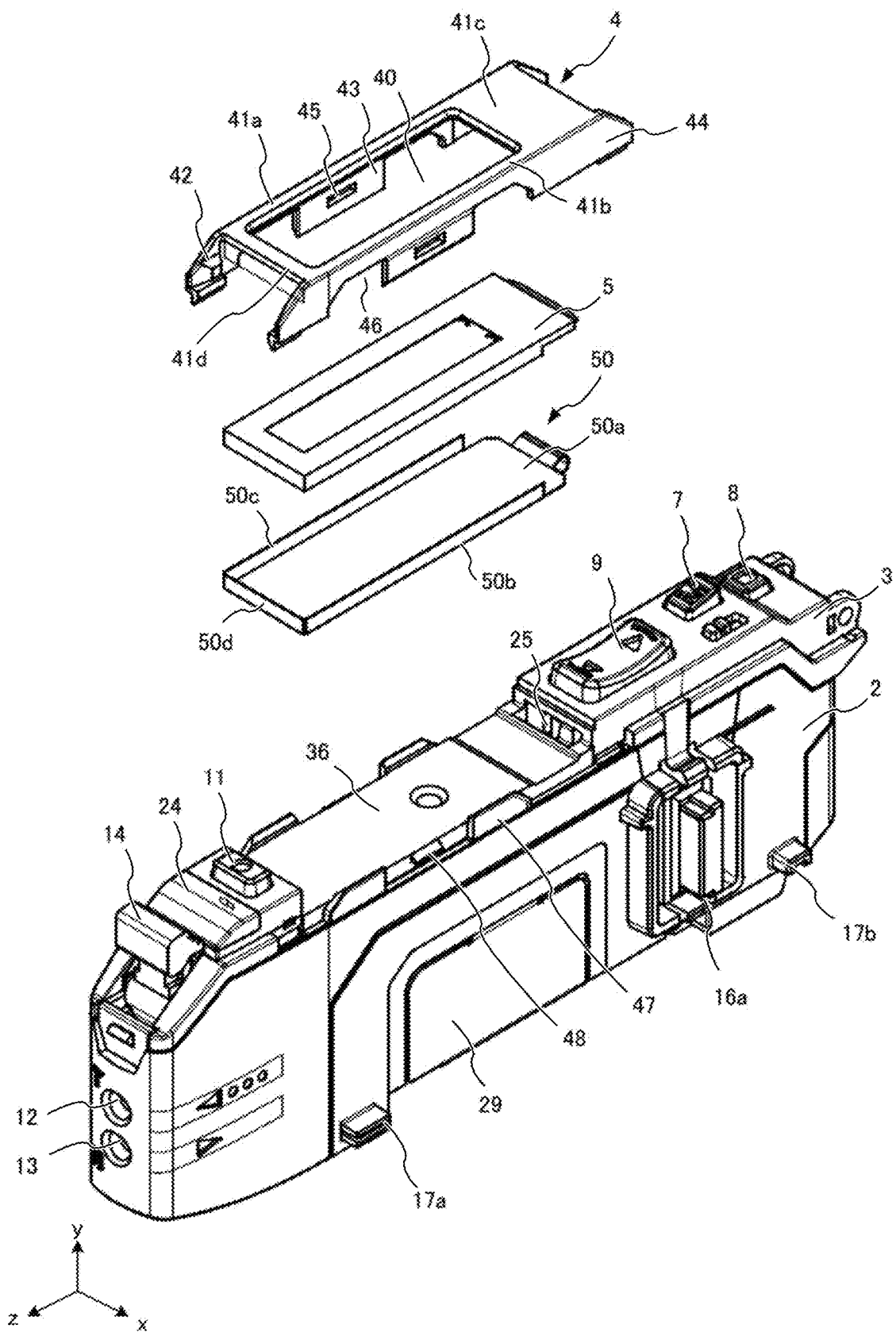
FIG. 5 is a perspective view showing a positional relation among a cover member, a display, and a shield member.

FIG. 5 is a perspective view for explaining the cover member 4 in detail. The cover member 4 includes two front legs 42, two center legs 43, and two rear legs 44. A window section 40 is provided on the upper surface of the cover member 4. The user can view a display surface of the display 5 through the window section 40. The window section 40 is surrounded by four frames. A left frame 41a and a right frame 41b are thin compared with a front frame 41d and a rear frame 41c. This is to secure a display area in the latitudinal direction of the photoelectric switch 1. The rear frame 41c has a large area compared with the other frames. This is to protect, with the rear frame 41c, for example, an IC configured to control the display 5. Character information and the like may be printed on the rear frame 41c. Because the rear frame 41c has a certain degree of an area, even if the user presses the adjustment button 9 with a finger, display information on the display 5 is less easily hidden by the finger. That is, the rear frame 41c can sufficiently separate the display 5 and the buttons from each other. Note that, because the area of the front frame 41d is small, the display lamp 24 and the display 5 can be set close to each other. Consequently, information transmitting mechanisms focused by the user can be integrated in one place. Four cutouts 46 in total are provided on the right side surface and the left side surface of the cover member 4. The four cutouts 46 fit with the four fringes 47 provided in the upper case 3, position the cover member 4 with respect to the upper case 3, and fixes the cover member 4 to the upper case 3. Recessed sections 45 are respectively provided on the inner surface sides of the two center legs 43. The recessed sections 45 fit with the claw sections 48 respectively provided on the right side surface and the left side surface of the upper case 3. A shield member 50 may be adopted to protect the front surface, the bottom surface, the left side surface, and the right side surface of the display 5. The shield member 50 includes a front wall 50d configured to protect the front surface of the display 5, a bottom section 50a configured to protect the bottom surface of the display 5, a right wall 50b configured to protect the right side surface of the display 5, and a left wall 50c configured to protect the left side surface of the display 5. The display 5 is held by the backbone member 36 and the cover member 4 in a state in which the display 5 is covered with the shield member 50. The shield member 50 is formed by an FPC (flexible printed circuit board).

Figure 6:
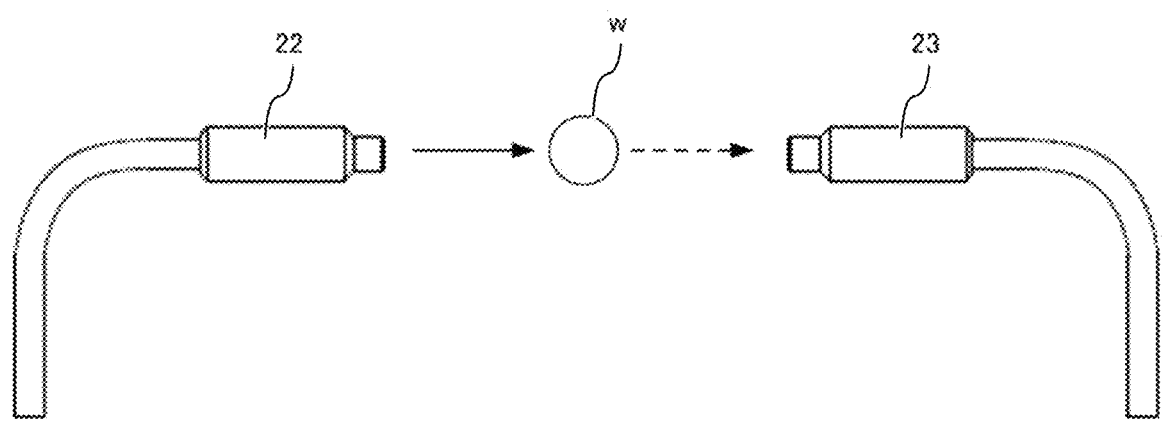
FIG. 6 is a diagram showing fiber heads of photoelectric switches disposed adjacent to each other.

FIG. 6 shows the light projecting fiber 22 and the light receiving fiber 23 in the photoelectric switch 1 of a transmission type. One end of the light projecting fiber 22 emits detection light to a passing region of work w. The other end of the light projecting fiber 22 is inserted into the hole 12. Light from the light emitting element is made incident on the other end of the light projecting fiber 22. Detection light from the passing region is made incident on one end of the light receiving fiber 23. The other end of the light receiving fiber 23 is inserted into the hole 13. Light is emitted to the light receiving element from the other end. When the work w is absent in the passing region, light emitted from an emission end of the light projecting fiber 22 is made incident on an incident end of the light receiving fiber 23. When the work w is present in the passing region, the light emitted from the emission end of the light projection fiber 22 is blocked by the work w. Therefore, the light is not made incident on the incident end of the light receiving fiber 23. The controller 6 detects presence or absence of the work w according to whether light is not made incident on the light receiving fiber 23.

Note that, in the photoelectric switch 1 of a reflection type, light output from the light projecting fiber 22 is reflected on the work w. The reflected light is made incident on the light receiving fiber 23. When the work w is absent in the passing region, light emitted from the emission end of the light projecting fiber 22 is not made incident on the incident end of the light receiving fiber 23. When the work w is present in the passing region, the light emitted from the emission end of the projection optical fiber 22 is reflected by the work w. The reflected light is made incident on the incident end of the light receiving fiber 23. The controller 6 detects presence or absence of the work w according to whether light is made incident on the light receiving fiber 23. Note that the present invention is applicable to the photoelectric switch 1 of the reflection type in which a reflector is used.

Controller

Figure 7:
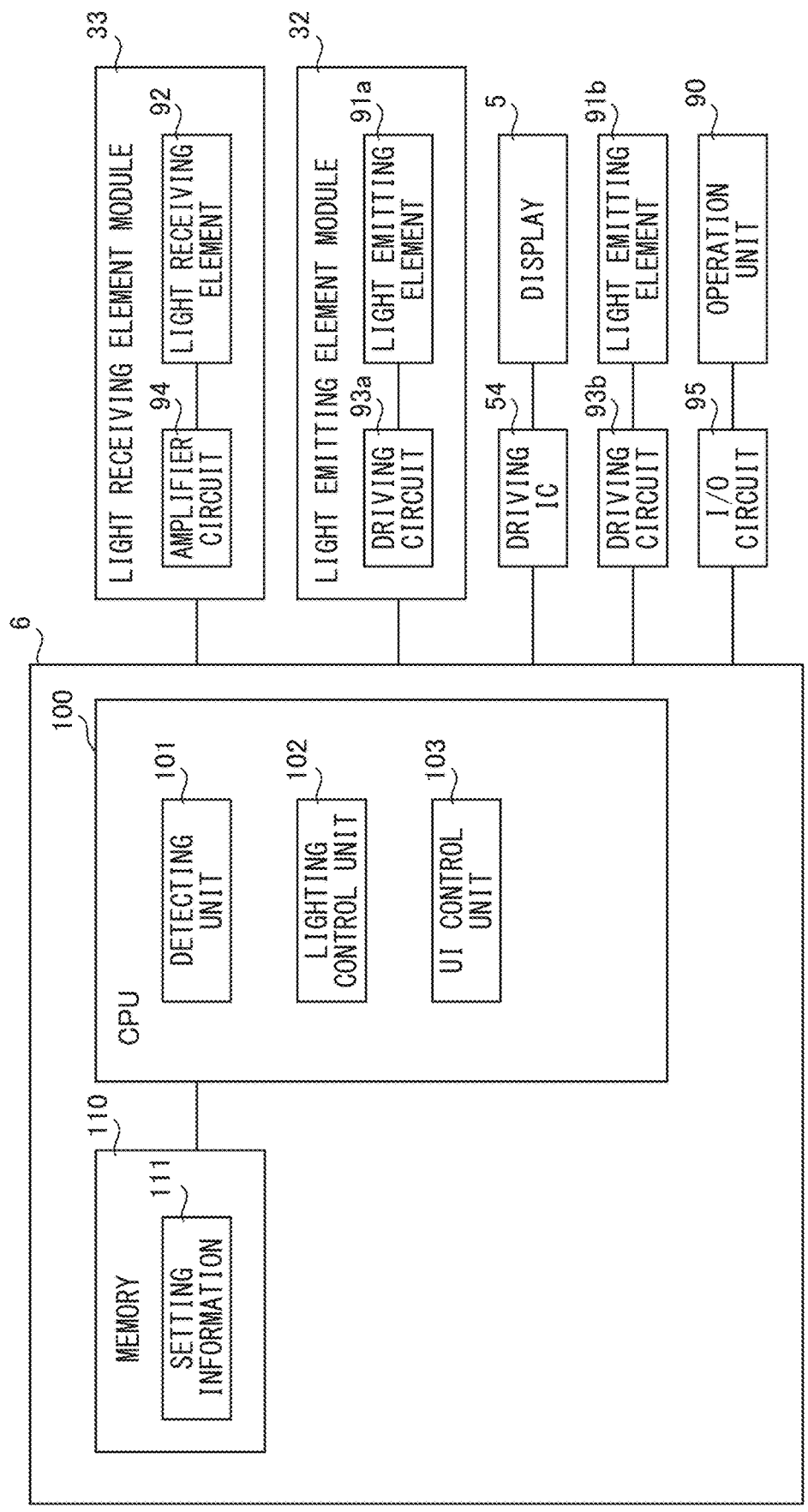
FIG. 7 is a diagram for explaining a controller.

FIG. 7 is a block diagram for explaining the controller 6. A CPU 100 realizes various functions according to a control program stored in a ROM, which is a part of a memory 110. The memory 110 is a storage device including a RAM and a ROM. In the memory 110, for example, setting information 111 including a threshold Th and the like set by the adjustment button 9 is stored.

The light emitting element module 32 includes a light emitting element 91a configured to emit detection light and make the detection light incident on the light projecting fiber 22 and a driving circuit 93a configured to supply a driving current for driving the light emitting element 91a to the light emitting element 91a. The light receiving element module 33 includes a light receiving element 92 configured to receive light made incident from the light receiving fiber 23 and output a light reception signal according to a light receiving amount and an amplifier circuit 94 configured to amplify the light receiving signal. A driving IC 54 is a circuit configured to drive the display 5 according to an instruction of the CPU 100. A driving circuit 93b is a circuit configured to drive a light emitting element 91b that supplies light to the display lamp 24.

An I/O circuit 95 is a circuit configured to output a signal DET indicating a detection result of the work w to an external device (e.g., an external display device or a PLC) and receive an input of information from the external device.

Further, the I/O circuit 95 receives a signal corresponding to user operation through an operation unit 90. The operation unit 90 includes the adjustment button 9, the mode button 8, and the active receiver button 7.

A detecting unit 101 of the CPU 100 acquires, through an A/D converter or the like, a light receiving amount of detection light received by the light receiving element 92. The detecting unit 101 compares the light receiving amount of the detection light and the threshold Th and outputs a comparison result to the I/O circuit 95. A lighting control unit 102 controls lighting timing of the light emitting element 91a and generates a pulse signal for instructing lighting of the light emitting element 91a and supplies the pulse signal to the driving circuit 93a. For example, a UI control unit 103 displays the light receiving amount and the threshold Th on the display 5 through the driving IC 54. The UI control unit 103 may cause the display 5 to simultaneously display, together with the light receiving amount and the threshold Th, other information (additional information) such as information representing an operation mode in addition to the light receiving amount and the threshold Th. Further, the UI control unit 103 may cause the display 5 to display a setting menu for receiving setting by a user concerning various setting items. UI is an abbreviation of user interface.

Switching of a Display Form

As in the present invention, in the photoelectric switch 1, a dimension in the x direction of which is approximately 10 mm (e.g., 5 mm or more and 14 mm or less), a display area of the display 5 is extremely narrow. Therefore, a light receiving amount and a threshold are desirably displayed in as large characters as possible. However, when adjustment of the threshold is executed, auxiliary information other than the light receiving amount and the threshold is sometimes necessary for the user. For example, the light receiving amount of the light emitting element 91a can be switched in several stages. That is, the user may not be able to appropriately set the threshold unless the user grasps an operation mode (a power mode) of the light emitting element 91a. Therefore, in the present invention, the UI control unit 103 provides necessary information to the user by switching a display form.

Figure 8:
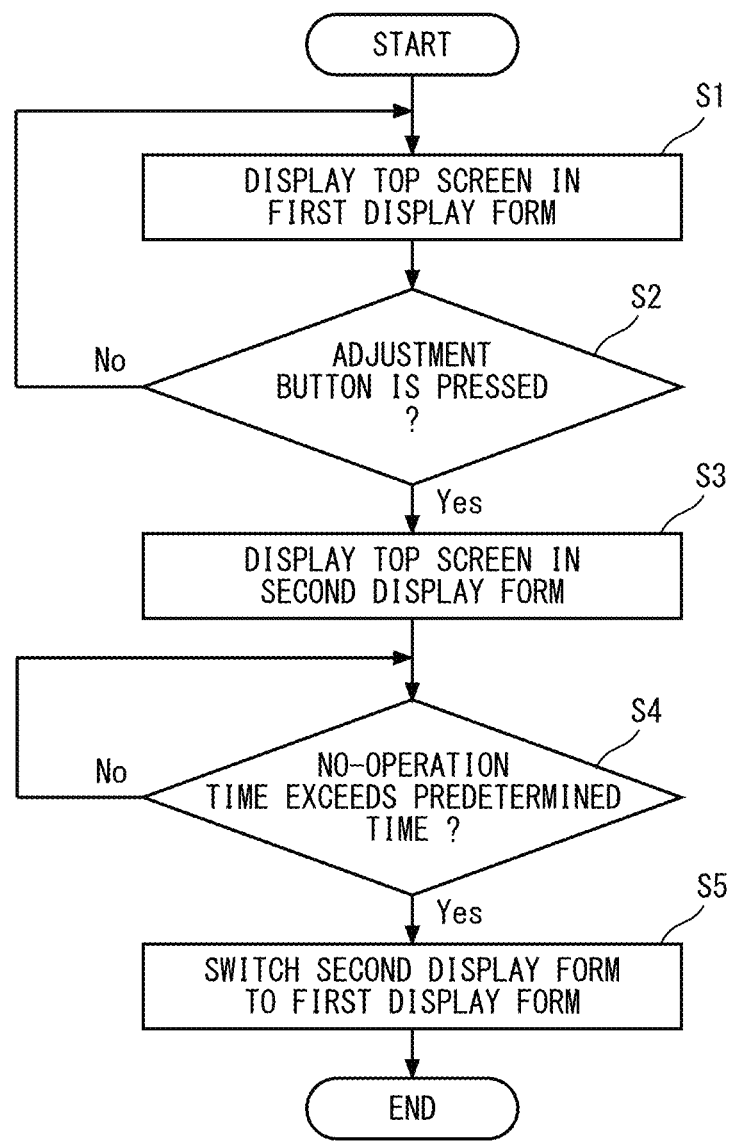
FIG. 8 is a flowchart showing switching of a display form.

FIG. 8 is a flowchart showing user interface control executed by the CPU 100 (the UI control unit 103).

Figure 9A:
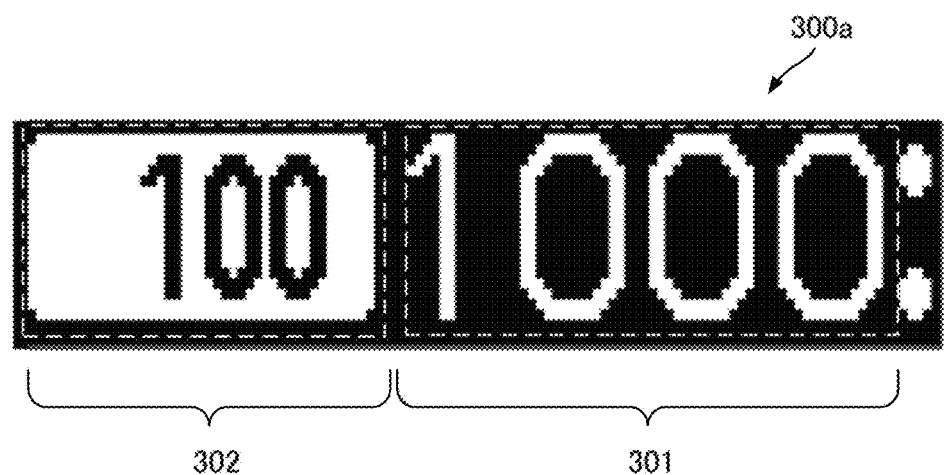
FIGS. 9A and 9B are diagrams showing examples of user interfaces.

In S1, the UI control unit 103 displays a top screen in a first display form. The top screen is a default screen displayed in a state in which the user does not operate the operation unit 90. FIG. 9A shows an example of a UI 300a confirming to the first display form. The UI 300a includes a first display region 301 and a second display region 302. Note that frame lines formed by dotted lines are frame lines for indicating regions. The frame lines are not displayed on the display 5. The first display region 301 is a region for displaying a physical quantity measured by a sensor unit, that is, a light receiving amount measured by the photoelectric switch 1. The second display region 302 is a region for displaying a threshold. In this way, in the first display form, visibility of numerical values by the user is improved by displaying the light receiving amount and the threshold using the dimension in the x direction of the display 5 almost to the maximum. Note that the UI control unit 103 may highlight the threshold. Highlighting is reversal display shown in FIG. 9A, surrounding display for surrounding the threshold with a frame and displaying the threshold, display of the threshold by a display color different from a display color of the physical quantity, and the like. The reversal display is a display form for using a color of a numerical value of the light receiving amount in the first display form as a background color in the second display form and using a background color in the first display form as a color of a numerical value in the second display form.

In S2, the UI control unit 103 determines whether the adjustment button 9 of the operation unit 90 is pressed. The adjustment button 9 may include two switches to increase and reduce the threshold. For example, a front half of the adjustment button 9 may correspond to a first switch for increasing the threshold. A rear half of the adjustment button 9 may correspond to a second switch for increasing the threshold. When either the first switch or the second switch is pressed by the user, the UI control unit 103 determines that the adjustment button 9 is pressed and proceeds to S3.

Figure 9B:
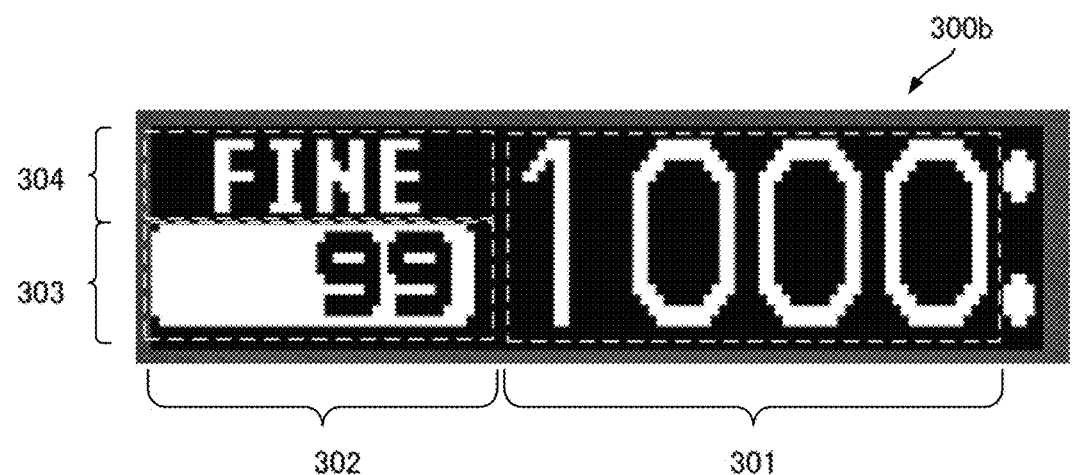

In S3, the UI control unit 103 displays the top screen in the first display form. FIG. 9B shows an example of a UI 300b conforming to the second display form. The area of a first display region 301 of the UI 300b conforming to the second display form is the same as the area of the first display region 301 of the UI 300a in the first display form. This is because the light receiving amount is the most important information. On the other hand, in the UI 300b, the second display region 302 is divided into a third display region 303 and a fourth display region 304. The third display region 303 is a region where the threshold is displayed in the second display form. The fourth display region 304 is a region where the operation mode is displayed. Compared with the area of the second display region 302, the area of the third display region 303 is small. That is, the area of a display region for the threshold in the second display region 302 is reduced to secure a display region for the additional information (the operation mode). Because the third display region 303 is smaller than the second display region 302, a character size for displaying the threshold is changed. The threshold is displayed by thin characters in the second display region 302. The threshold is displayed by thick characters in the third display region 303. Consequently, the threshold is easily read even if the character size is set small. When the adjustment button 9 is pressed by the user while the UI 300b is displayed on the display 5, the UI control unit 103 adjusts the threshold according to user operation and displays the adjusted threshold in the third display region 303.

In S4, the UI control unit 103 determines whether a no-operation time exceeds a predetermined time. The UI control unit 103 clocks, using a timer or the like, an elapsed time (the no-operation time) from the time when the user operates the operation unit 90 last. The timer may be incorporated in the CPU 100 or may be implemented by a counter circuit. When the no-operation time exceeds the predetermined time, the UI control unit 103 proceeds to S5. When detecting user operation on the operation unit 90, the UI control unit 103 resets the timer.

In S5, the UI control unit 103 switches the display form of the top screen from the second display form to the first display form. Consequently, the UI 300a in the first display form is displayed on the display 5 again. That is, when the no-operation state continues for a predetermined time, the UI control unit 103 determines that the adjustment of the threshold ends and switches the UI 300b back to the UI 300a. As explained above, the area of the upper surface of the photoelectric switch 1 of the present invention is extremely small. Therefore, a space for providing a dedicated button for informing the adjustment end to the CPU 100 is considered to be substantially absent. Therefore, the UI control unit 103 determines the continuation of the no-operation state as the adjustment end. Note that, even if the UI 300b is switched back to the UI 300a, the user can immediately switch the UI 300a to the UI 300b by operating the adjustment button 9 again.

Modifications of the UI

Figure 10A:
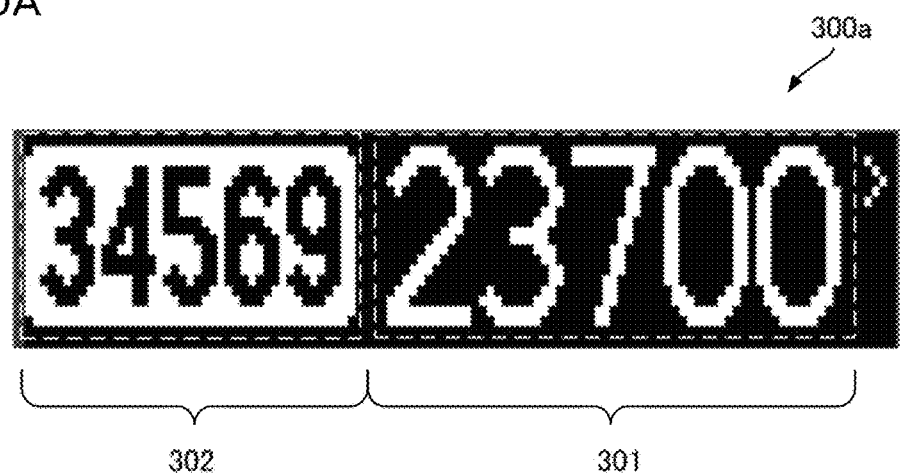
FIGS. 10A to 10C are diagrams showing examples of the user interfaces.

FIG. 10A shows the UI 300a in the first display form at the time when the number of digits of a numerical value increases. The light emitting element 91a has a plurality of operation modes (power modes). When an operation mode with a large light emitting amount is selected among the plurality of operation modes, the light receiving amount cannot be represented by a four-digit numerical value. Therefore, the UI control unit 103 may increase or reduce a display digit number of the light receiving amount according to the operation mode of the light emitting element 91a. However, even if the display digit number of the light receiving amount is changed, the UI control unit 103 may maintain the area of the first display region 301 for displaying the light receiving amount. As shown in FIG. 10A, the UI control unit 103 may increase or reduce a display digit number of the threshold as well according to the operation mode of the light emitting element 91a. However, the area of the second display region 302 is maintained.

Figure 10B:
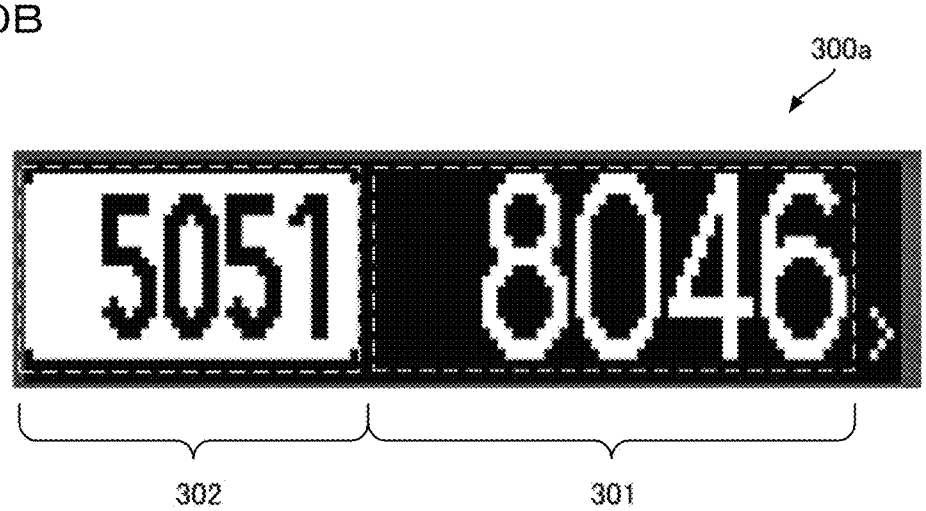
Figure 10C:
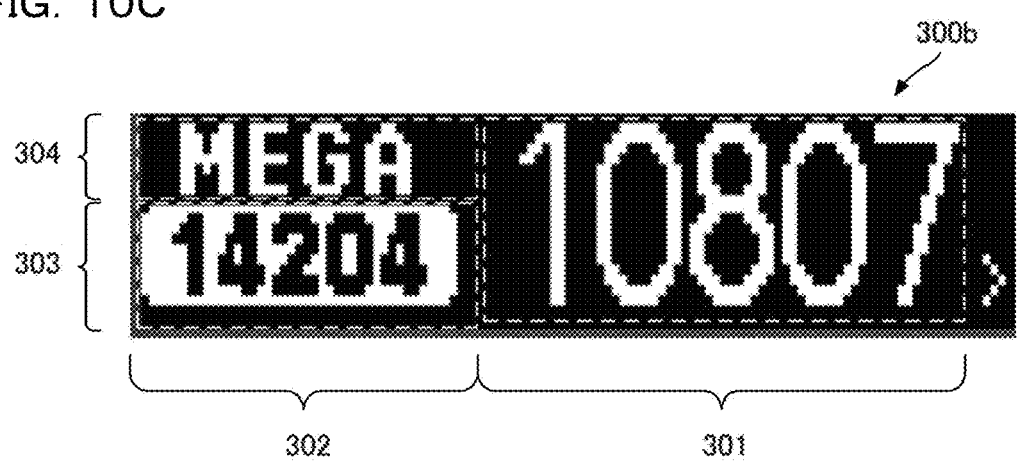

FIG. 10B shows the UI 300a in the first display form at the time when the number of digits of a numerical value increases. Even if the light receiving amount decreases as the light receiving amount can be displayed by a four-digit numerical value, the UI control unit 103 maintains the display digit number as five digits. Similarly, even if the threshold decreases to be displayable by a four-digit numerical value, the UI control unit 103 maintains the display digit number as five digits. In this way, the display digit number may be increased and reduced according to the operation mode and may not depend on the numerical value.

FIG. 10O shows the UI 300b in the second display form at the time when the number of digits of a numerical value increases. The UI control unit 103 increases or reduces the display digit number of the third display region 303 according to the operation mode of the light emitting element 91a. Note that the UI control unit 103 may increase and reduce the display digit number of the light receiving amount according to the operation mode of the light emitting element 91a in the UI 300b in the second display form as well. The UI control unit 103 may maintain the area of the first display region 301 and the area of the second display region 302 in the second display form as well.

Figure 11A:
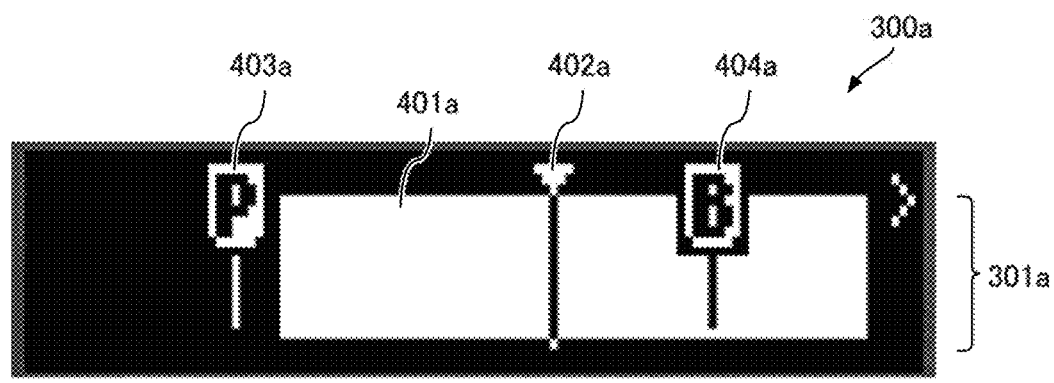
FIGS. 11A and 11B are diagrams showing examples of the user interfaces.

FIG. 11A shows the UI 300a in the first display form for displaying the light receiving amount in a graph format. The UI control unit 103 may display the light receiving amount with a bar graph, a pie graph, or the like. A bar-type graph 401a is a graphic object that extends and shrinks according to the light receiving amount. The bar-type graph 401a extends in the forward direction (the z direction) of the photoelectric switch 1 in proportion to an increase in the light receiving amount. A threshold mark 402a is an object indicating the position of the threshold with respect to the bar-type graph 401a. A peak mark 403a is an object indicating a peak value (a maximum value) of the light receiving amount. A bottom mark 404a is an object indicating a bottom value (a minimum value) of the light receiving amount. In this example, the bar-type graph 401a is displayed in a first display region 301a.

Figure 11B:
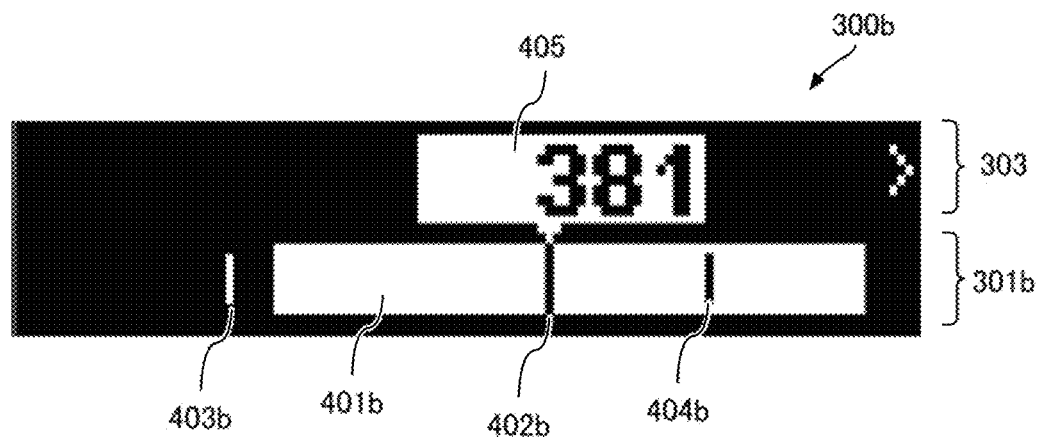

FIG. 11B shows the UI 300b in the second display form for displaying the light receiving amount in a graph format. The UI 300b is used by the user to adjust the threshold. Therefore, the user would desire to understand an actual threshold as a numerical value. The UI control unit 103 may reduce the area of the first display region 301a to create a first display region 301b. Further, the UI control unit 103 may reduce the area of the first display region 301a to display the light receiving amount in the third display region 303 as a numerical value. The third display region 303 includes a numerical value display region 405 for the light receiving amount. Note that, according to the reduction of the area of the first display region 301a, the UI control unit 103 executes reduction or simplification of the graph 401a, the threshold mark 402a, the peak mark 403a, and the bottom mark 404a and displays a graph 401b, a threshold mark 402b, a peak mark 403b, and a bottom mark 404b. The peak mark 403a includes a character "P", which is a capital letter of "peak". The peak mark 403b may not include the character "P". The bottom mark 404a includes a character "B", which is a capital letter of "bottom". The bottom mark 404b may not include the character B. By omitting these characters, it is possible to secure the third display region 303 wider.

Figure 12A:
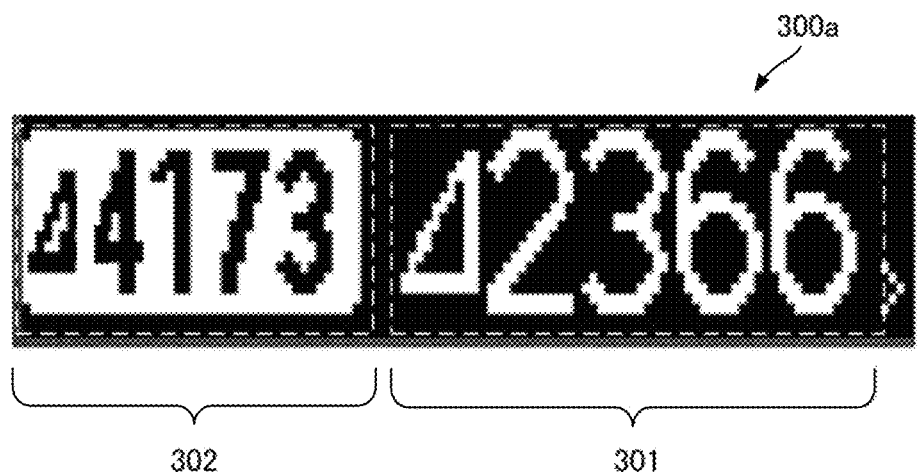
FIGS. 12A and 12B are diagrams showing examples of the user interfaces.

FIG. 12A shows the UI 300a in the first display form for displaying a differential value of the light receiving amount and the threshold of the differential value. In order to indicate that a numerical value displayed in the first display region 301 is a differential value, the UI control unit 103 attaches a Δ mark to the head of the numerical value. In order to indicate that a threshold displayed in the second display region 302 is a differential value of the light receiving amount, the UI control unit 103 attaches a Δ mark to the head of a numerical value.

Figure 12B:
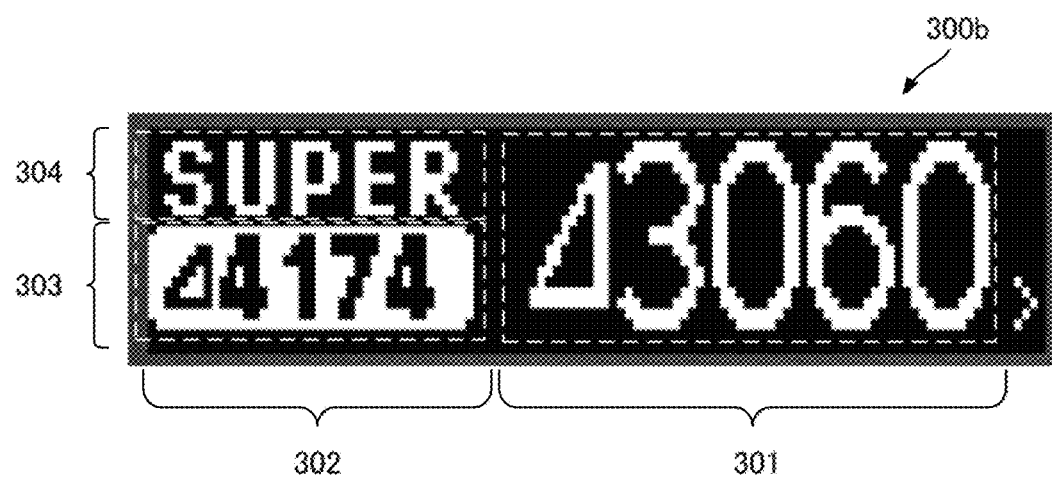

FIG. 12B shows the UI 300b in the second display form for displaying a differential value of the light receiving amount and a threshold of the differential value. In order to indicate that a threshold displayed in the third display region 303 is a differential value of the light receiving amount, the UI control unit 103 attaches a Δ mark to the head of a numerical value.

Figure 13A:
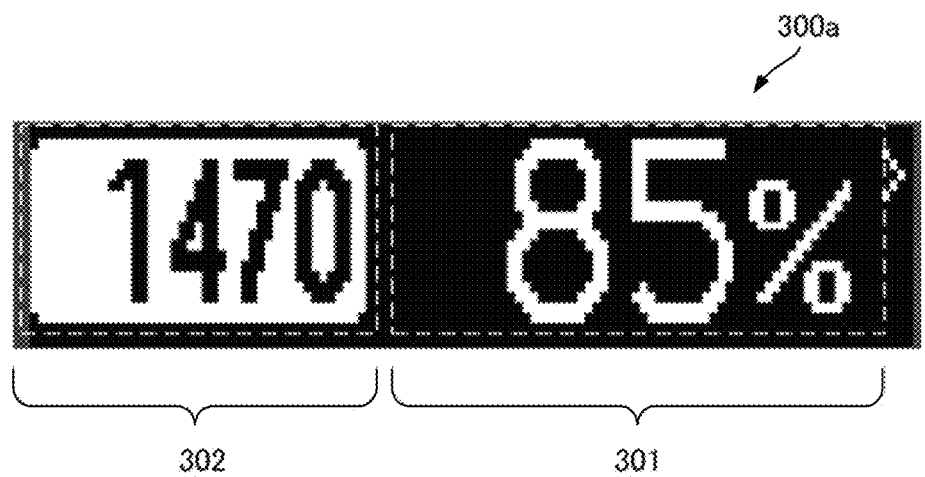
FIGS. 13A and 13B are diagrams showing examples of the user interfaces.
Figure 13B:
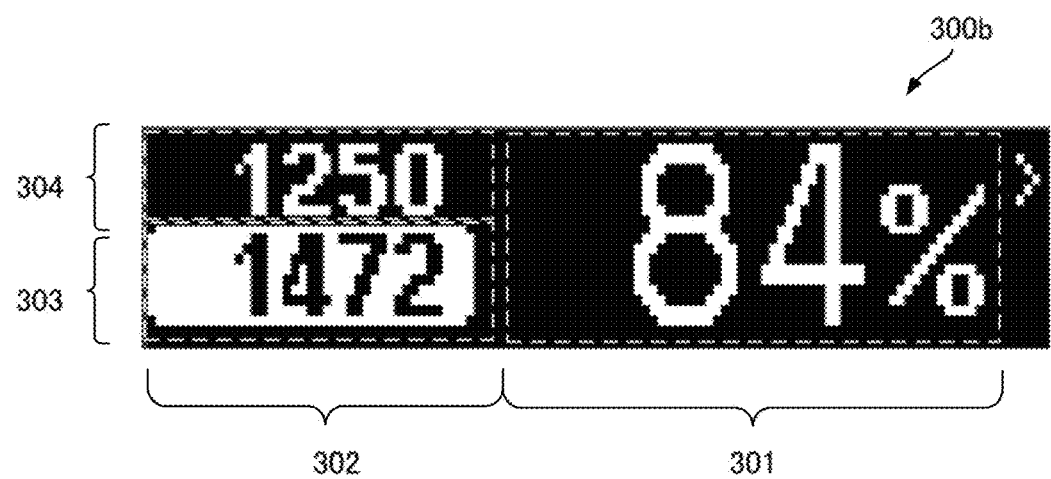

FIG. 13A shows the UI 300a in the first display form for displaying a margin [%] of the light receiving amount with respect to the threshold. The UI control unit 103 displays the threshold in the second display region 302, calculates a margin of the light receiving amount with respect to the threshold, and displays the margin in the first display region 301. The UI control unit 103 includes a calculating unit for the margin. The UI control unit 103 may display, together with the margin, %, which is a unit mark, in order to indicate to the user that the margin is shown.

Figure 14A:
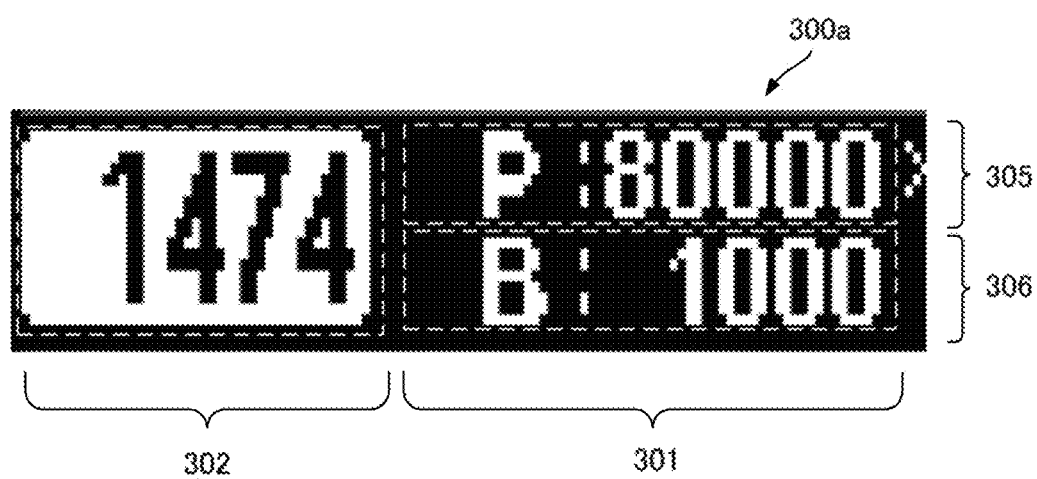
FIGS. 14A and 14B are diagrams showing examples of the user interfaces.

FIG. 14A shows the UI 300a in the first display form for displaying a peak value and a bottom value of the light receiving amount. The UI control unit 103 secures a fifth display region 305 and a sixth display region 306 in the first display region 301, displays the peak value of the light receiving amount in the fifth display region 305, and displays the bottom value of the light receiving amount in the sixth display region 306. Note that the UI control unit 103 may display a character "P" indicating the peak value in the fifth display region 305. Similarly, the UI control unit 103 may display a character "B" indicating the bottom value in the sixth display region 306. If the number of displayed numerical values increases, the user cannot easily grasp what is indicated by which numerical value. Therefore, these characters help the user to understand meanings of the numerical values. The UI control unit 103 compares a peak value of a light receiving amount obtained in the past and a present light receiving amount and, if the present light receiving amount exceeds the peak value, substitutes the present light receiving amount in the peak value to update the peak value. Similarly, the UI control unit 103 compares a bottom value of the light receiving amount obtained in the past and the present light receiving amount and, if the present light receiving amount is smaller than the bottom value, substitutes the present light receiving amount in the bottom value to update the bottom value. In this way, the UI control unit 103 includes a peak-value determining unit and a bottom-value determining unit. The UI control unit 103 displays the threshold in the second display region 302. Note that a definition of the peak value and a definition of the bottom value may be different. For example, the peak value may be a maximum value among light receiving amounts exceeding the threshold. If setting for switching a detection signal to ON when the light receiving amount is larger than the threshold is adopted, the peak value may be a maximum value of light receiving amount in a period in which the detection signal is ON. The peak value is updated every time a level of the detection signal is switched from ON to OFF. Like the peak value, the bottom value may be a minimum value of light receiving amounts smaller than the threshold. The bottom value is updated every time the level of the detection signal is switched from OFF to ON.

Figure 14B:
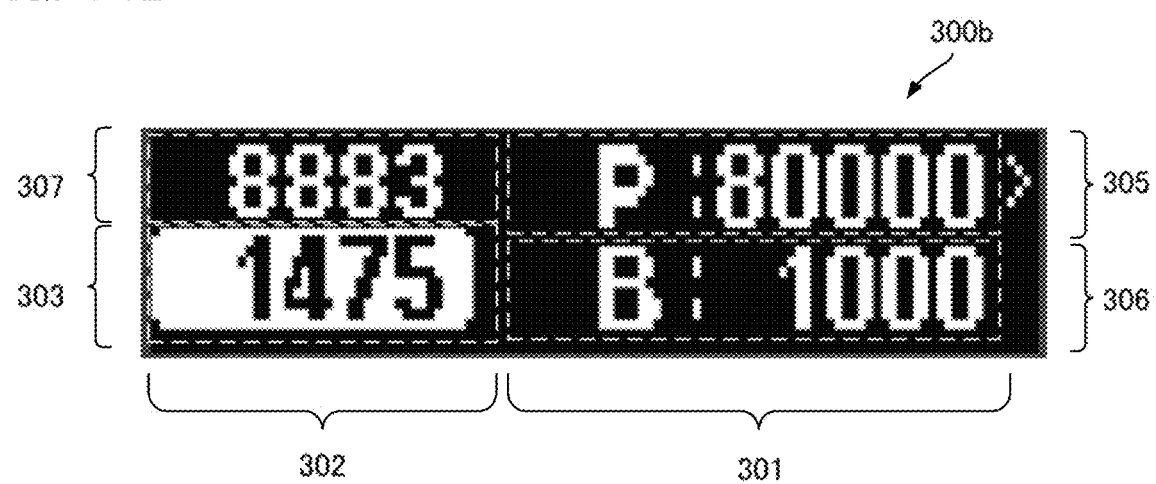

FIG. 14B shows the UI 300b in the second display form for displaying a peak value and a bottom value of the light receiving amount. The UI control unit 103 secures the third display region 303 and a seventh display region 307 in the second display region 302, displays the threshold in the third display region 303, and displays the light receiving amount in the seventh display region 307. The user adjusts the threshold while referring to a present light receiving amount. Therefore, the display of the light receiving amount helps the user to adjust the threshold.

Figure 15A:
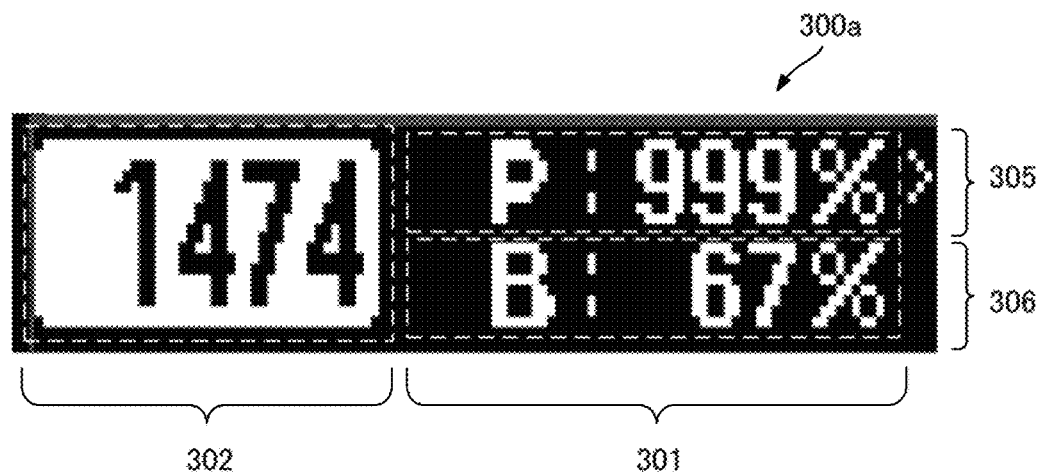
FIGS. 15A and 15B are diagrams showing examples of the user interfaces.

FIG. 15A shows the UI 300a in the first display form for displaying a peak value and a bottom value of a margin [%] of the light receiving amount with respect to the threshold. The UI control unit 103 secures the fifth display region 305 and the sixth display region 306 in the first display region 301, displays a peak value of the margin in the fifth display region 305, and displays a bottom value of the margin in the sixth display region 306. The UI control unit 103 displays the threshold in the second display region 302.

Figure 15B:
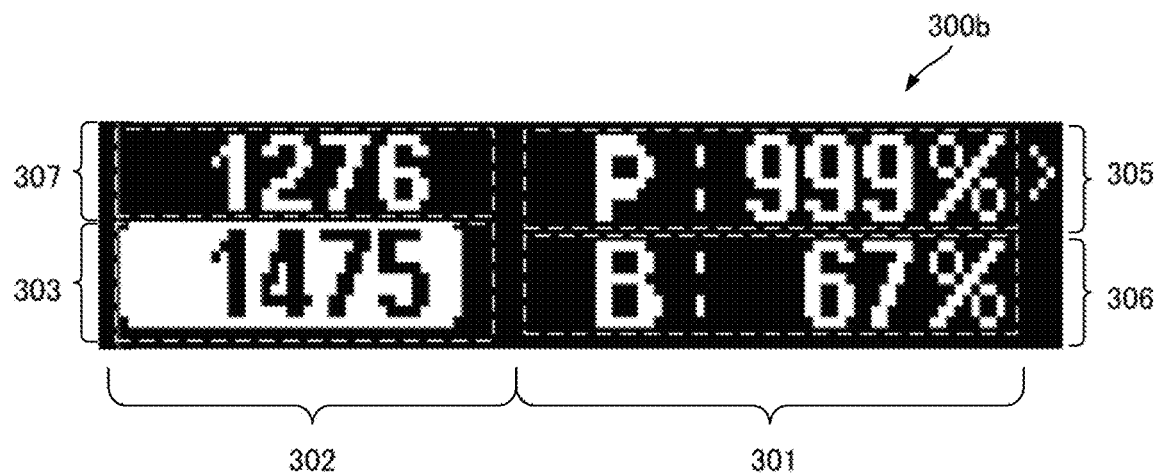

FIG. 15B shows the UI 300b in the second display form for displaying a peak value and a bottom value of a margin [%] of the light receiving amount with respect to the threshold. The UI control unit 103 secures the third display region 303 and the seventh display region 307 in the second display region 302, displays the threshold in the third display region 303, and displays the light receiving amount in the seventh display region 307. The display of the light receiving amount helps the user to adjust the threshold.

Setting Menu

According to the improvement of functions of the photoelectric switch 1, it would be convenient for the user if setting items for setting the functions can be displayed on the display 5 of the photoelectric switch 1. In the slim-type photoelectric switch in the past, since the seven-segment LED is adopted, it is difficult to display the setting items understandably to the user. In the present invention, because the dot matrix display is adopted as the display 5, it is possible to display the setting items understandably to the user. On the other hand, as functions increase, setting items also increase. The dimension in the x direction of the display 5 is proximately 10 mm at most. Therefore, characters displayable on the display 5 would be displayed in only one row. For example, when twenty setting items are present, the user can only reach a target setting item by pressing a button at least nineteen times. Therefore, in the present invention, a plurality of setting menus are provided and a setting menu to be displayed is selected according to user operation to improve usability. For example, the user is allowed to reach a setting item for setting a display language with as few times of user operation as possible. Consequently, words by a language unintended by the user are prevented from being displayed until the user reaches the setting item for setting the display language. Note that it is also conceivable that the photoelectric switch 1 displays the setting item of the display language every time the user starts the photoelectric switch 1 for the first time or every time the user initializes setting of the photoelectric switch 1. However, the photoelectric switch 1 displays the light receiving amount and the threshold on the top screen. Therefore, usability is lost if the user cannot use the photoelectric switch 1 unless the user sets a language. That is, it would be convenient for the user if the photoelectric switch 1 displays the light receiving amount and the threshold even if the user does not set a language. Therefore, it is important that the user considering that it is necessary to set a language can reach a setting item of the language with a fewer times of operation.

Figure 16:
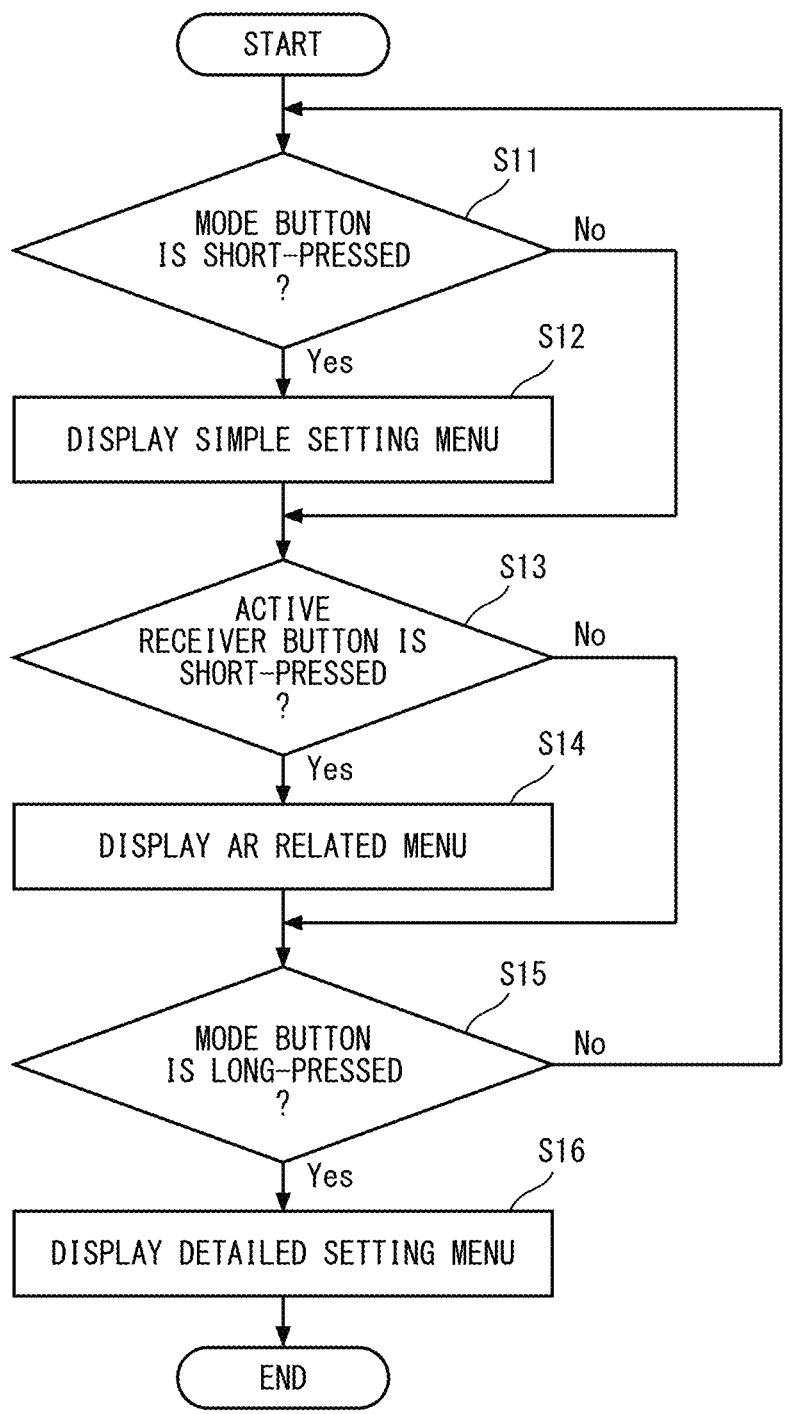
FIG. 16 is a flowchart showing switching of a menu.

FIG. 16 is a flowchart showing processing concerning setting menus.

In S11, the UI control unit 103 determines whether the mode button 8 is short-pressed. The short-press means pressing a button for a relatively short time. When detecting that the mode button 8 is short-pressed, the UI control unit 103 proceeds to S12. Unless the mode button 8 is short-pressed, the UI control unit 103 skips S12 and proceeds to S13.

In S12, the UI control unit 103 displays a simple setting menu on the display 5.

Figure 17:
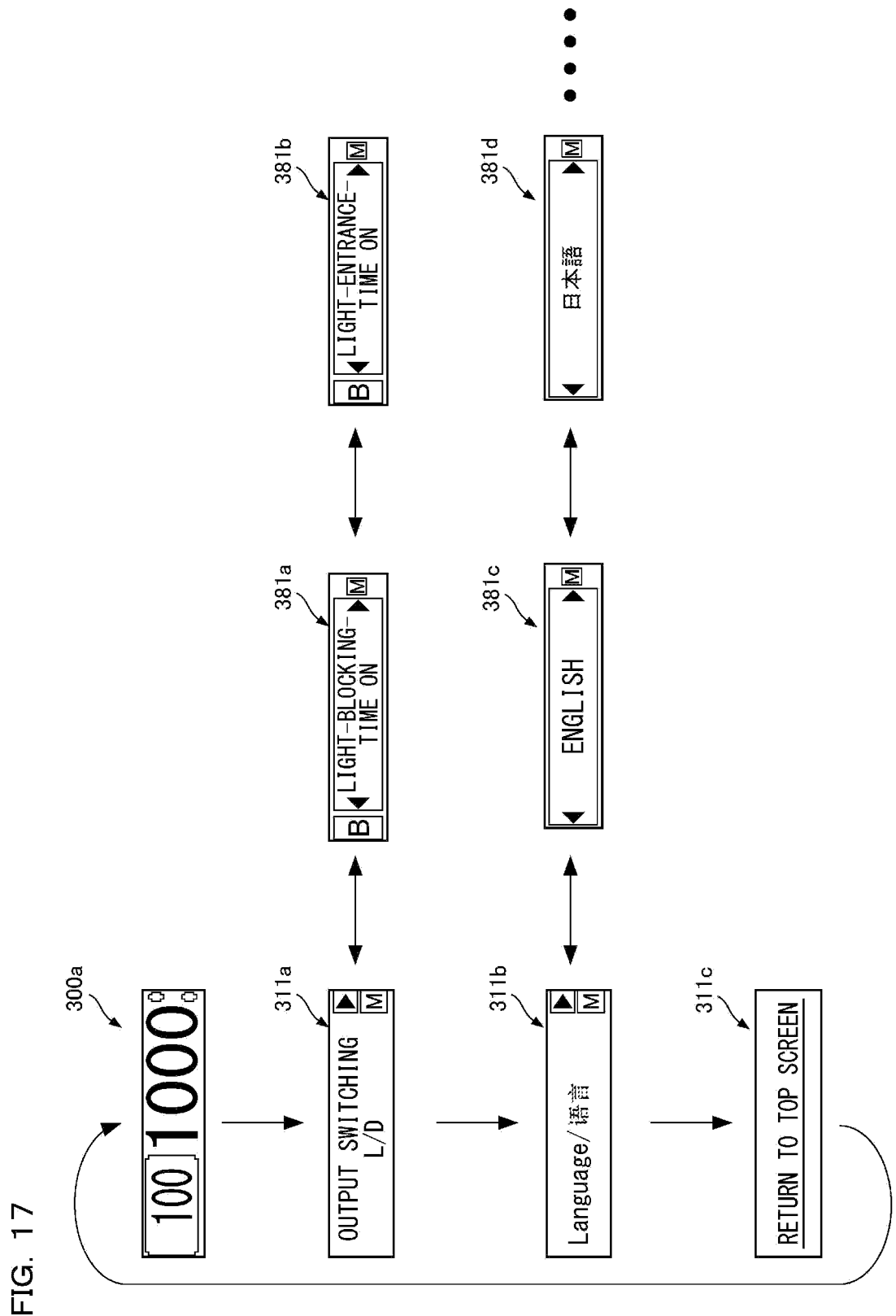
FIG. 17 is a diagram for explaining transition of a menu.

FIG. 17 shows an example of the simple setting menu. When the mode button 8 is short-pressed while the UI 300a in the first display form is displayed as the top screen, the UI control unit 103 displays the simple setting menu on the display 5. The simple setting menu includes a setting item 311a for selecting an output method for a detection result of the work w, a setting item 311b for setting a language, and a setting item 311c for returning to the top screen. When the adjustment button 9 is pressed while the setting item 311a is displayed, the UI control unit 103 displays a submenu for selecting the output method. In particular, when the rear end portion of the adjustment button 9 is pressed, the UI control unit 103 displays the submenu for selecting the output method. Note that the setting item 311a may include a mark indicating a button for displaying the submenu. As shown in FIG. 1, this mark may be displayed by printing, engraving, or the like at the rear end portion of the adjustment button 9 as well. The setting item 311a may include a mark indicating a button for displaying the next setting item. In this example, "M" indicating the mode button 8 is included in the setting item 311a. The submenu includes a selection item 381a for switching an output of the I/O circuit 95 to ON when light traveling from the light projecting fiber 22 to the light receiving fiber 23 is blocked and a selection item 381b for switching the output to ON when the light enters the light receiving fiber 23. Every time the adjustment button 9 is pressed, the UI control unit 103 switches the selection item 381a and the selection item 381b. When the mode button 8 is pressed, the UI control unit 103 decides a selection result. The selection item 381a and the selection item 381b may include marks indicating buttons that should be operated to switch the selection item 381a and the selection item 381b. In this example, a mark attached to the front half portion of the adjustment button 9 and a mark attached to the rear half portion of the adjustment button 9 are displayed in the selection item 381a and the selection item 381b. A mark indicating a button that should be operated to decide selection may be displayed in the selection item 381a and the selection item 381b. In this example, "M" indicating the mode button 8 is displayed in the selection item 381a and the selection item 381b. A selection result concerning the selection item 381a and the selection item 381b may be used for lighting control for the display lamp 24.

The UI control unit 103 switches the setting item 311a to the setting item 311b, switches the setting item 311b to the setting item 311c, and switches the setting item 311c to the UI 300a on the basis of the short-press of the mode button 8. Note that when the adjustment button 9 is pressed while setting item 311b is displayed, the UI control unit 103 displays a submenu for selecting a language. The submenu may include at least a selection item 381c for selecting English and a selection item 381d for selecting Japanese. Naturally, a larger number of languages (e.g., German, French, Spanish, Chinese, and Korean) may be selectable. The UI control unit 103 switches the selection item every time the adjustment button 9 is pressed. When detecting that the mode button 8 is pressed, the UI control unit 103 decides selection of a language by the user. For example, when detecting that the mode button 8 is pressed while the selection item 381a is displayed on the display 5, the UI control unit 103 sets the display language to English. The setting item 311a for selecting a power mode includes a plurality of selection items respectively corresponding to a plurality of power modes. Because switching of the power mode can be frequently executed in the photoelectric switch 1, the setting item 311a for selecting the power mode is included in the simple setting menu. In a sensor unit other than the photoelectric switch 1 as well, a setting item that is frequently set is included in the simple setting menu.

In S13, the UI control unit 103 determines whether the active receiver button 7 is short-pressed. If the active receiver button 7 is short-pressed, the UI control unit 103 proceeds to S14. If the active receiver button 7 is not short-pressed, the UI control unit 103 skips the S14 and proceeds to S15.

In S14, the UI control unit 103 displays an AR related menu on the display 5. AR is an abbreviation of active receiver.

Figure 18:
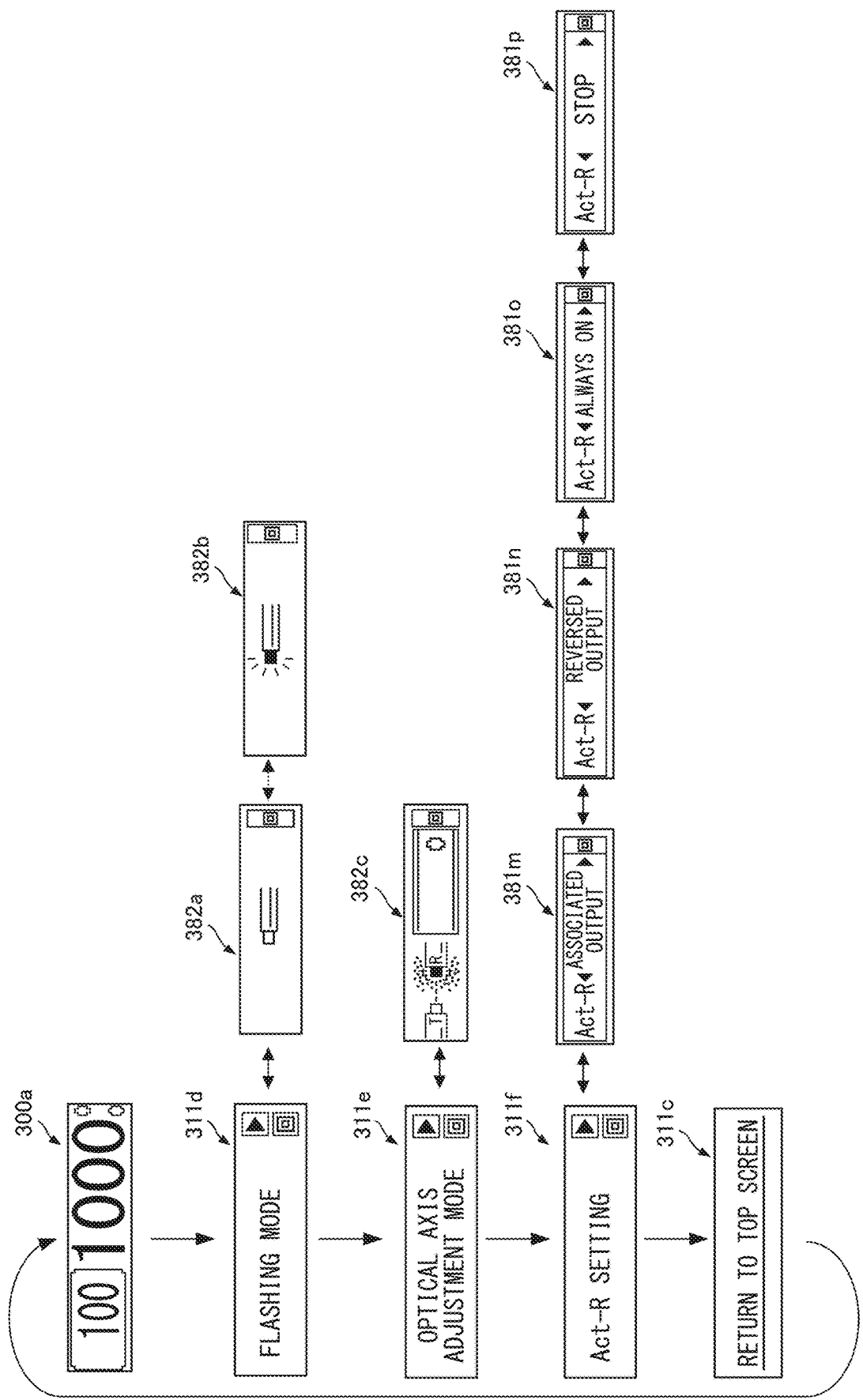
FIG. 18 is a diagram for explaining transition of a menu.

FIG. 18 shows an example of the AR related menu. When the active receiver button 7 is short-pressed while the UI 300a in the first display form is displayed as the top screen, the UI control unit 103 displays the AR related menu on the display 5. The AR related menu includes, for example, a setting item 311d for setting a flashing mode, a setting item 311e for setting an optical axis adjustment mode, a setting item 311f for setting the active receiver, and the setting item 311c for returning to the top screen.

The flashing mode is a mode for temporarily flashing a not-shown light emitting element provided on the light receiving surface of the light receiving element 92. Light emitted by the light emitting element is emitted to the outside from the light receiving fiber 23. In general, the light receiving fiber 23 is used to receive light and does not emit light. However, confirmation of disconnection of the light receiving fiber 23 can be executed by emitting light from the distal end of the light receiving fiber 23. When the adjustment button 9 is pressed while the setting item 311d is displayed, the UI control unit 103 switches valid/invalid of the flashing mode. In particular, when the flashing mode is valid, the UI control unit 103 may represent the flashing of the light emitting element by alternately displaying an animation image 382a and an animation image 382b.

The optical axis adjustment mode is a mode for adjusting the optical axis of the light receiving fiber 23 and the optical axis of the light projecting fiber 22. For example, the user could easily confirm the position of the light receiving fiber 23 by selecting to light the light emitting element of the light receiving fiber 23. Note that, when the optical axis adjustment mode is validated, the UI control unit 103 may display an image 382c meaning optical axis adjustment on the display 5.

The active receiver setting includes a submenu including a plurality of selection items for setting lighting/extinction of the light emitting element of the light receiving fiber 23. A selection item 381m is an item for selecting to light the light emitting element of the light receiving fiber 23 in association with a detection result of the work w (associated output). In the associated output, the light emitting element of the light receiving fiber 23 is lit/extinguished in association with lighting/extinction of the display lamp 24. A selection item 381n is an item for selecting to light the light emitting element of the light receiving fiber 23 to be reversed with respect to a detection result of the work w (reversed output). When the reversed output is selected, the light emitting element of the light receiving fiber 23 is lit/extinguished in association with lighting/extinction of the display lamp 24. A selection item 381o is an item for selecting to always light the light emitting element of the light receiving fiber 23. A selection item 381p is an item for selecting to always extinguish the light emitting element of the light receiving fiber 23. The UI control unit 103 switches the selection items 381m to 381p and displays the selection items 381m to 381p on the display 5 every time the adjustment button 9 is pressed. At this time, when the active receiver button 7 is short-pressed, the UI control unit 103 decides that the selection item displayed at that point in time among the selection items 381m to 381p is selected by the user and returns to the setting item 311f. Note that the selection items 381m to 381p may include a mark indicating the active receiver button 7, a mark indicating the front half portion of the adjustment button 9, and a mark indicating the rear half portion of the adjustment button 9. Consequently, the user could visually understand a button for transitioning among the selection items and a button for deciding the selection item. The UI control unit 103 switches these setting items in order every time the active receiver button 7 is short-pressed. The setting items may include a mark indicating the active receiver button 7 for switching the setting items in order. This mark also coincides with the mark attached to the surface of the active receiver button 7 shown in FIG. 1.

In S15, the UI control unit 103 determines whether the mode button 8 is long-pressed. The long-press means pressing a button for a relatively long time. When detecting that the mode button 8 is long-pressed, the UI control unit 103 proceeds to S16. If the mode button 8 is not long-pressed, the UI control unit 103 returns to S11.

In S16, the UI control unit 103 displays a detailed setting menu on the display 5.

Figure 19:
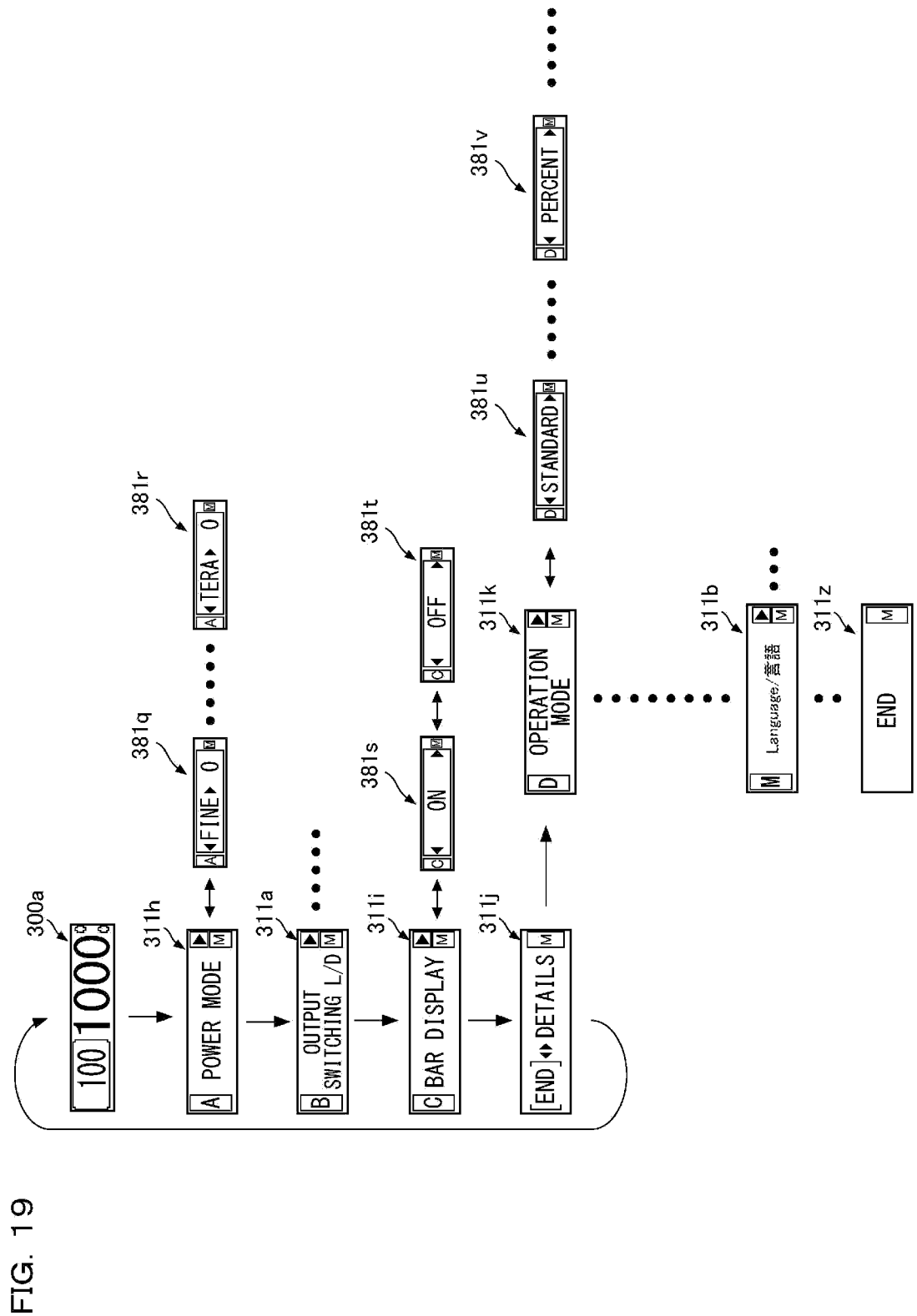
FIG. 19 is a diagram for explaining transition of a menu.

FIG. 19 shows a part of the detailed setting menu. When the mode button 8 is long-pressed while the UI 300a in the first display form is displayed as the top screen, the UI control unit 103 displays the detailed setting menu on the display 5. The detailed setting menu includes a first menu and a second menu. The first menu includes a setting item 311h for selecting the power mode, the setting item 311a concerning output switching, a setting item 311i for selecting whether graph display of the light receiving amount is executed, and a setting item 311j for selecting whether to shift from the first menu to the second menu. The UI control unit 103 switches the setting item every time the mode button 8 is short-pressed. When detecting the long-press of the mode button while the setting item 311*i* is displayed, the UI control unit 103 shifts from the first menu to the second menu.

A submenu of the setting item 311*h* includes a plurality of selection items 381*q* and 381*r* and the like for selecting a light emitting amount of the light emitting element 91*a*. For example, the light emitting amount may be divided into eight stages. Names for explaining the light emitting amount understandably to the user such as FINE, SUPER, MEGA, and TERA may be displayed on the plurality of selection items 381*q* and 381*r*. The UI control unit 103 may change a number of digits of display of the light receiving amount according to the selected light emitting amount. The setting item 311*i* includes a selection item 381*s* for validating the graph display and a selection item 381*t* for invalidating the graph display.

The second menu may include, for example, twenty or more setting items. A setting item 311*k* is a setting item for selecting a display form of the light receiving amount. A selectin item 381*u* is a selection item for selecting to display the light receiving amount as a numerical value. A selection item 381*v* is a selection item for selecting to display the light receiving amount as a margin. When the adjustment button 9 is pressed while the setting item 311*k* is displayed, the UI control unit 103 displays the selection item 381*u* and the selection item 381*v*. On the other hand, when the mode button 8 is pressed while the setting item 311*k* is displayed, the UI control unit 103 displays a selection item next to the selection item 381*u*. Note that the second menu includes the setting item 311*b* for setting a language and a setting item 311*z* for ending setting.

The UI control unit 103 displays different menus on the display 5 according to two operation methods of the long-press and the short-press. The long-press is an operation method in which operation is relatively difficult. The short-press is an operation method in which operation is relatively easy. In this way, the different menus may be displayed according to degrees of difficulty of the operation methods. Such operation methods include, for example, pressing a small button (a degree of difficulty is high) and pressing a large button (a degree of difficulty is low). The operation methods may include simultaneously pressing a plurality of buttons (a degree of difficulty is high) and pressing a single button (a degree of difficulty is low).

The UI control unit 103 may also display the menus explained above when the photoelectric switch 1 detects the work w (the photoelectric switch 1 is in operation) and receive a change of setting.

The UI control unit 103 may adopt animation display when switching a certain setting item to the next setting item. It is assumed that a setting item is, for example, an image including twenty rows. In this case, the UI control unit 103 displays a first row to a twentieth row of a first setting item. Subsequently, the UI control unit 103 displays the second row to the twentieth row of the first setting item and a first row of a second setting item. That is, the second row of the first setting item is displayed at the top and the first row of the second setting item is displayed at the bottom. Subsequently, the UI control unit 103 displays the third row to the twentieth row of the first setting item and the first row and a second row of the second setting item. By adopting such scroll display, the UI control unit 103 finally displays the first row to a twentieth row of the second setting item on the display 5. Consequently, a display image is gradually changed from the first setting item to the second setting item and the animation display of the setting items is realized.

As shown in FIG. 1, the rear end portion of the cover member 4 is a plane having a certain degree of an area. Moreover, the rear end portion is located right next to the display 5. Therefore, the UI control unit 103 may display, on the display 5, a mark (e.g., in FIG. 10A) indicating whether light-blocking-time ON (dark ON/D-on) is selected or light-entrance-time ON (light-ON/L-on) is selected. Note that characters of D-on and characters of L-on may be attached (e.g., printed, engraved, or stuck) to the rear end portion of the cover member 4 adjacent to the mark displayed on the display 5.

In FIG. 1, the operation unit 90 is disposed in a position different from the display 5. However, a so-called touch panel-type display in which the operation unit 90 is mounted on the display 5 may be adopted as the photoelectric switch 1. In this case, a different menu may be displayed according to a position of user operation on the display surface (a touch sensing surface) of the display 5 or a movement of a finger of the user. For example, a first sensing region on the touch sensing surface may be short-pressed (a degree of difficulty is low) or long-pressed (a degree of difficulty is high). The UI control unit 103 may display a different menu according to a difference in the movement of the finger such as flick operation or double-click operation on the touch sensing surface.

Figure 20A:
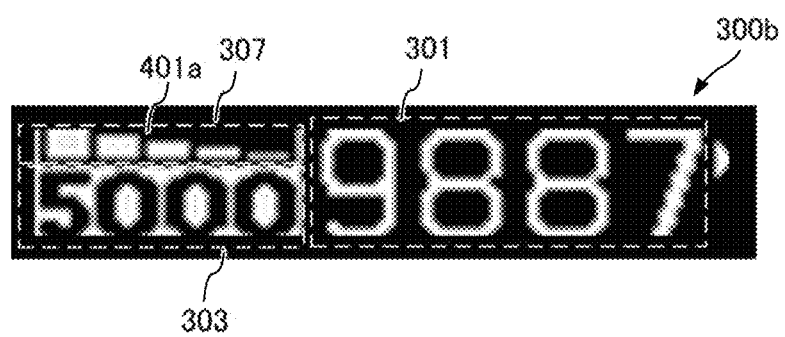
FIGS. 20A to 20C are diagrams for explaining examples of graphs.
Figure 20B:
Figure 20C:

FIG. 20A shows another example of the UI 300*b* in the second display form. In particular, in the seventh display region 307, a step-wise graph 401*a* such as a graph indicating radio wave intensity of a cellular phone is displayed. FIG. 20B shows a linear graph 401*a*. The linear graph 401*a* extends in the left direction according to the light receiving amount. FIG. 20C shows a semicircular-type graph 401*a*. In this way, graphs of various types can be adopted as the graph 401*a*.

Figure 21A:
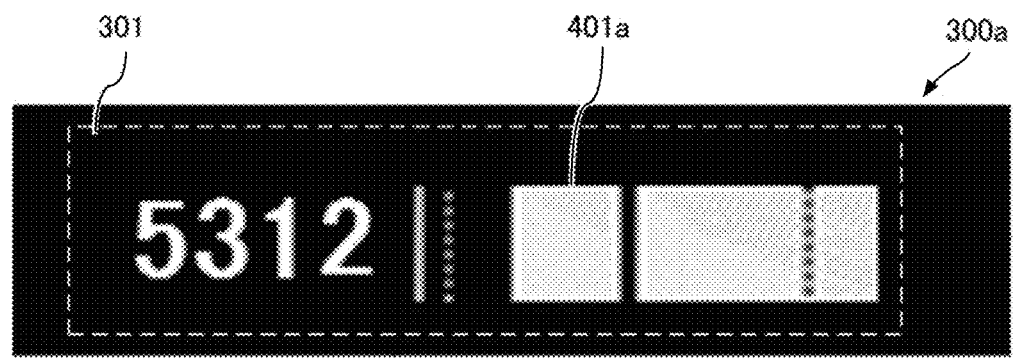
FIGS. 21A and 21B are diagrams showing examples of user interfaces.
Figure 21B:
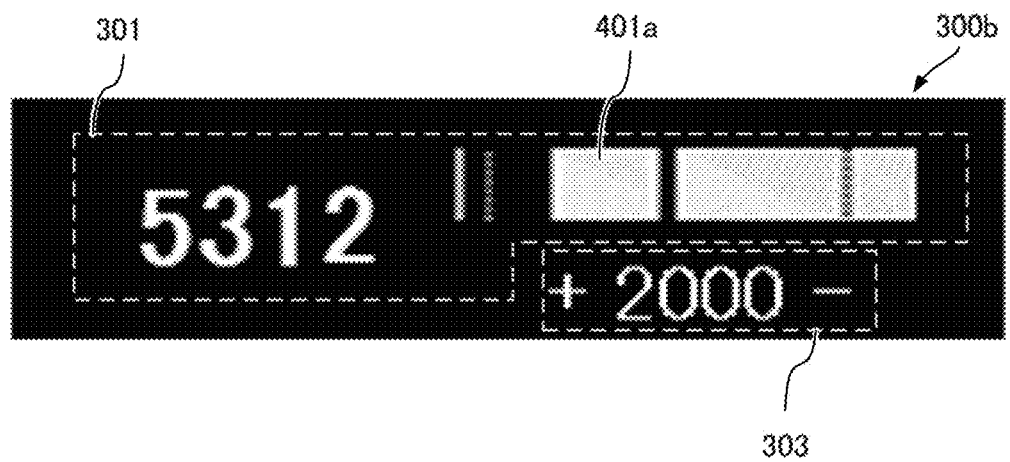

FIG. 21A shows the UI 300*a* in the first display form for displaying the light receiving amount as both of a numerical value and a graph. FIG. 21B shows the UI 300*b* in the second display form for displaying the light receiving amount as both of a numerical value and a graph. The UI control unit 103 reduces a part of the first display region 301 to secure the third display region 303 for displaying the threshold. In the first display region 301, the area of a numerical value display region is the same in the UI 300*a* and the UI 300*b*. However, a display region of the graph 401*a* is reduced and the third display region 303 is secured.

SUMMARY

As explained with reference to FIG. 1 and the like, the photoelectric switch 1 includes the housing having a substantially rectangular parallelepiped shape. That is, the housing is elongated. The display 5 is an example of a display unit attached to the outer surface, that is, a first surface of the housing. In the past, because a display is housed inside a housing of a photoelectric switch, the distance from the outer surface of the housing to the display is long and display information is less easily seen. In this embodiment, because the display 5 is attached to the outer surface of the housing, the distance from the outer edge of the photoelectric switch 1 to the display 5 is short and display information of the display 5 is easily seen. The light emitting element module 32, the hole 12, and the like are an example of a light projecting unit provided near a second surface located adjacent to the first surface. The light receiving element module 33 and the hole 13 are an example of a light receiving unit provided near the second surface located adjacent to the first surface. The adjustment button 9 and the like are an example of a receiving unit provided on the first surface or the display unit and configured to receive user operation. The controller 6 is an example of a display control unit configured to cause the display unit to display a threshold adjusted through the receiving unit and a signal value indicating an amount of light received by the light receiving unit. The control board 30 is an example of a control board (a first substrate) housed on the inside of the housing, the display control unit being mounted on or connected to the control board. The signal cable 51 is an example of a signal cable for connecting the control board 30 and the display 5. The display 5 includes a connecting section connected to the signal cable 51. The connecting section of the display 5 is disposed between the display region and the signal cable 51 in the longitudinal direction of the housing. The display 5 has two short sides and two long sides. The signal cable 51 is connected to the side of one short side of the two short sides. Consequently, a connection structure of the signal cable 51 capable of securing a sufficient display area concerning the display 5 in the photoelectric switch 1 is provided. A shield member 50 is an example of a shield member provided at least in a part of the side surface of the display 5. The cover member 4 is an example of a cover member that sandwiches the shield member 50 between the cover member 4 and the side surface of the display 5 and covers at least a part of the side surface of the display 5. In this way, the shield member 50 has a role of protecting the display 5 from a shock.

In the embodiment explained above, the photoelectric switch 1 is adopted as an example of the sensor unit. However, the sensor unit may be a sensor unit that detects another physical quantity such as a pressure sensor. The detecting unit 101 is an example of a detecting unit configured to detect a physical quantity (e.g., a light receiving amount or a pressure). The display 5 is an example of a dot-matrix display unit configured to display the physical quantity detected by the detecting unit. The display lamp 24, the output cable to the outside, the I/O circuit 95, and the like are an example of an output unit configured to output a comparison result of the physical quantity detected by the detecting unit and a threshold. The operation unit 90 is an example of an operation unit configured to receive adjustment operation for the threshold. The UI control unit 103 is an example of a control unit configured to control the dot-matrix display unit. As shown in FIGS. 9A and 9B, the UI control unit 103 may be configured to cause the dot-matrix display unit to display the threshold and the physical quantity in the first display form and cause the dot-matrix display unit to display additional information (e.g., a power mode) different from the physical quantity and different from the threshold together with the physical quantity and the threshold in the second display form. The area of a display region (e.g., the third display region 303) for the threshold in the second display form is smaller than the area of a display region (e.g., the second display region 302) for the threshold in the first display form. The area of a display region (the fourth display region 304) for the information in the second display form may be secured by reducing the area of the display region (the second display region 302) for the threshold. However, as shown in FIG. 21, the area of the first display region 301 may be reduced and the third display region 303 may be secured. In this way, when a display item is added, a part of the display regions is reduced and a display region for the added display item is secured. Note that, when a display item is deleted, for example, when the UI 300b is switched back to the UI 300a, the area of a display region for the deleted display item may be added to the area of the other display regions. Note that the area of the display region for the physical quantity in the second display form may be smaller than the area of the display region for the physical quantity in the first display form. In this case, the area of the display region (the fourth display region 304) for the information in the second display form may be secured by reducing the area of the display region for the physical quantity. In this way, the display region for one of the threshold and the physical quantity may be reduced and the display region for the added display item may be secured.

The additionally displayed information may be information indicating the operation mode (e.g., the power mode) of the sensor unit.

The UI control unit 103 may be configured to cause the dot-matrix display unit to display, in both of the first display form and the second display form, the threshold updated according to adjustment operation received by the operation unit 90. That is, the UI control unit 103 reflects the threshold updated through the UI 300b on the UI 300a as well.

The UI control unit 103 may be configured to cause the dot-matrix display unit to highlight the threshold. For example, a method of highlighting the threshold may be anyone of reversal display, surrounding display, and display of the threshold by a display color different from a display color of the physical quantity. The UI control unit 103 may be configured to cause the dot-matrix display unit to display the threshold with thin characters in the first display form and cause the dot-matrix display unit to display the threshold with thick characters in the second display form.

As shown in FIGS. 9A and 9B and the like, the area of the display region for the physical quantity in the first display form may be larger than the area of the display region for the threshold in the first display form. The area of the display region for the physical quantity in the second display form may be larger than a sum of the area of the display region for the threshold and the area of the display region for the information in the second display form.

As shown in FIG. 9B and the like, the height of the display region for the threshold in the second display form may be larger than the height of the display region for the information in the second display form. Consequently, important information can be displayed larger.

When adjustment operation for the threshold is received by the operation unit 90, the UI control unit 103 switches the first display form to the second display form. When a predetermined time elapses after the first display form is switched to the second display form, the UI control unit 103 may switch the second display form back to the first display form. Consequently, the user can omit operation for switching the second display form back to the first display form.

As shown in FIG. 11A and the like, the first display form may be a form for displaying the physical quantity with a graph and displaying a threshold mark indicating a position of the threshold in the graph. As shown in FIG. 11B and the like, the second display form may be a form for displaying the physical quantity with a graph and displaying the threshold mark in the graph and displaying a numerical value indicating the threshold as additional information. As shown in FIGS. 11A and 11B and the like, the area of a display region for the threshold mark in the second display form may be smaller than the area of a display region for the threshold mark in the first display form. The area of a display region for the numerical value indicating the threshold in the second display form may be secured by reducing the area of the display region for the threshold mark and reducing a display area of the graph. As shown in FIG. 11A and the like, the first display form may include a peak mark indicating a peak value of the physical quantity and a bottom mark indicating a bottom value of the physical quantity.

The light emitting element module 32 is an example of a light projecting unit configured to project light on a detection region (a passing region) of the work w in order to detect the physical quantity. As shown in FIG. 11A and the like, the graph may be a bar graph. The UI control unit 103 may be configured to extend the bar graph toward the light projecting unit side as the physical quantity increases.

As shown in FIGS. 11A and 11B, a scale of the bar graph with respect to the physical quantity in the first display form and a scale of the bar graph with respect to the physical quantity in the second display form may coincide. The width of the bar graph in the first display form may be smaller than the width of the bar graph in the second display form. Because the scale is maintained, even if the UI 300a changes to the UI 300b, the user can easily intuitively grasp the light receiving amount.

The operation unit 90 may include a button (e.g., the mode button 8 or the active receiver button 7) for displaying a setting menu for setting the sensor unit. When the button is pressed, the UI control unit 103 may transition from the first display form or the second display form to a third display form and cause the dot-matrix display unit to display the setting menu. FIGS. 17, 18, and 19 show an example of the third display form.

As shown in FIG. 19, when the button is long-pressed, the UI control unit 103 may cause the dot-matrix display unit to display a first menu including a large number of setting items. As shown in FIG. 17, when the button is short-pressed, the UI control unit 103 may cause the dot-matrix display unit to display a second menu including a small number of setting items. As shown in FIG. 17, the setting item 311b for setting a display language may be included in the second menu.

The hierarchy of the setting of the language switching, the short-press, and the long-press explained above may be deformed as follows.

(1) The housing of the sensor unit may include a button for receiving an input of a setting change. When the short-press on the button is detected, a first setting change group is displayed. When the long-press on the button is detected, a second setting change group is displayed. The language switching is included in the first setting change group.

(2) In (1), the second setting change group may include a third setting change group for receiving a more detailed setting change. The language switching may be included in both of the first setting change group and the third setting change group.

(3) The housing may include a button for receiving an input of a setting change. When a first operation input to the button is received, a first setting change group is displayed. When a second operation input more complicated than the first operation input is received, a second setting change group is displayed. The language switching is included in the first setting change group. "Complicated" means that operation by the user such as pressing of a smaller button, long-press of a button, and simultaneous pressing of a plurality of buttons is difficult.

(4) In (3), the second setting change group may include a third setting change group for receiving a more detailed setting change. The language switching may be included in both of the first setting change group and the third setting change group.

(5) In (1) to (4), the language switching may be possible even during operation of the sensor unit.

(6) Mode selecting means capable of switching a simple mode for enabling simple setting and an application mode for enabling detailed setting may be further provided. There are button operation allocated to the simple mode and button operation allocated to the application mode. The language switching is included in the simple mode.

The change from the seven-segment type LED display to the dot-matrix type display enables display of numbers and characters (e.g., Japanese, Chinese, Korean, French, Italian, and Spanish) other than a part of the alphabet. That is, the dot-matrix type display can display setting items and setting content. In this case, the user presses a button or the like to cause the display to display the setting items while switching the display items in order. The sensor unit shipped from a factory is sometimes initially set to a language different from a language desired by the user. In this case, words of the undesired language are displayed many times before the user reaches language setting. This is because the language setting is usually provided in a deep position of a hierarchical menu because the language setting is not executed many times. According to the present invention, because the language switching can be executed by a simple method, the words of the undesired language would not be often displayed. Note that the sensor unit includes a plurality of language sets on the inside. In the present invention, the language setting may be provided not only in a shallow position but also in a deep position of the hierarchical menu.

What is claimed is:

1. A sensor unit comprising:
a housing;
a detecting unit configured to detect a physical quantity;
a dot-matrix display unit provided on the housing configured to display the physical quantity detected by the detecting unit;
an output unit configured to output a comparison result of the physical quantity detected by the detecting unit and a threshold;
an operation unit provided on the housing and configured to receive a user input for adjustment operation for the threshold, setting operation of the sensor unit or operation mode, or any combination thereof; and
a control unit configured to control the dot-matrix display unit, wherein
the control unit is configured to cause the dot-matrix display unit to display the threshold and the physical quantity in a first display form and cause the dot-matrix display unit to display, together with the physical quantity and the threshold, information representing an operation mode of the sensor unit and different from the physical quantity and different from the threshold in a second display form,
an area of a display region for one of the threshold and the physical quantity in the second display form is smaller than an area of the display region for the one of the threshold and the physical quantity in the first display form, and an area of a display region for the information in the second display form is obtained by reducing the area of the one display region for the threshold and the physical quantity, and
the control unit is configured to cause the dot-matrix display unit to switch from the first display form to the second display form upon receiving the user input when the first display form is displayed on the dot-matrix display unit and switch from the second display form back to the first display form without receiving the user input after a predetermined time elapses when the second display form is displayed on the dot-matrix display unit.

2. The sensor unit according to claim 1, wherein the information is information indicating an operation mode of the sensor unit.

3. The sensor unit according to claim 1, wherein the control unit is configured to cause the dot-matrix display unit to display, in both of the first display form and the second display form, the threshold updated according to adjustment operation received by the operation unit.

4. The sensor unit according to claim 1, wherein the control unit is configured to cause the dot-matrix display unit to highlight the threshold.

5. The sensor unit according to claim 4, wherein a method for highlighting the threshold is any one of reversal display, surrounding display, and display by a display color different from a display color of the physical quantity.

6. The sensor unit according to claim 1, wherein the control unit is configured to cause the dot-matrix display unit to display the threshold with thin characters in the first display form and display the threshold with thick characters in the second display form.

7. The sensor unit according to claim 1, wherein the area of the display region for the physical quantity in the first display form is larger than the area of the display region for the threshold in the first display form, and the area of a display region for the physical quantity in the second display form is larger than a sum of the area of the display region for the threshold and the area of the display region for the information in the second display form.

8. The sensor unit according to claim 1, wherein height of the display region for the threshold in the second display form is larger than height of the display region for the information in the second display form.

9. The sensor unit according to claim 1, wherein, when adjustment operation for the threshold is received by the operation unit, the control unit switches the first display form to the second display form.

10. The sensor unit according to claim 9, wherein the control unit switches the second display form back to the first display form when a predetermined time elapses after the first display form is switched to the second display form.

11. The sensor unit according to claim 1, wherein
the first display form is a form for displaying the physical quantity with a graph and displaying a threshold mark indicating a position of the threshold on the graph, and
the second display form is a form for displaying the physical quantity with a graph, displaying the threshold mark on the graph, and displaying a numerical value indicating the threshold as the information, and
an area of a display region for the threshold mark in the second display form is smaller than an area of the display region for the threshold mark in the first display form, and an area of a display region for the numerical value indicating the threshold in the second display form is secured by reducing the area of the display region for the threshold mark and reducing a display area of the graph.

12. The sensor unit according to claim 11, wherein the first display form includes a peak mark indicating a peak value of the physical quantity and a bottom mark indicating a bottom value of the physical quantity.

13. The sensor unit according to claim 11, further comprising a light projecting unit configured to project light on a detection region of work in order to detect the physical quantity, wherein
the graph is a bar graph, and
the control unit is configured to extend the bar graph toward the projecting unit side as the physical quantity increases.

14. The sensor unit according to claim 13, wherein a scale of the bar graph with respect to the physical quantity in the first display form and a scale of the bar graph with respect to the physical quantity in the second display form coincide, and width of the bar graph in the first display form is smaller than width of the bar graph in the second display form.

15. The sensor unit according to claim 1, wherein
the operation unit includes a button for causing the dot-matrix display unit to display a setting menu for setting the sensor unit, and
when the button is pressed, the control unit transitions from the first display form or the second display form to a third display form and causes the dot-matrix display unit to display the setting menu.

16. The sensor unit according to claim 15, wherein, when the button is long-pressed, the control unit causes the dot-matrix display unit to display a first menu including a large number of setting items and, when the button is short-pressed, the control unit causes the dot-matrix display unit to display a second menu including a small number of setting items.

17. The sensor unit according to claim 16, wherein a setting item for setting a display language is included in the second menu.

18. The sensor unit according to claim 1, wherein
the operation unit includes a button for causing the dot-matrix display unit to display a setting menu for setting the sensor unit;
the control unit configured to cause the dot-matrix display unit to display the setting menu when the button is pressed, and
wherein, when the button is pressed in a first manner, the control unit causes the dot-matrix display unit to display a first menu including a large number of setting items and, when the button is pressed in a second manner different from the first manner, the control unit causes the dot-matrix display unit to display a second menu including a small number of setting items, and
a setting item for changing a display language to another is included in the second menu.

19. The sensor unit according to claim 18, wherein the display language includes alphabet character and non-alphabet character.

20. A sensor unit comprising:
a housing;
a detecting unit configured to detect a physical quantity;
a dot-matrix display unit provided on the housing configured to display the physical quantity detected by the detecting unit;
an output unit configured to output a comparison result of the physical quantity detected by the detecting unit and a threshold;
an operation unit provided on the housing and configured to receive a user input for adjustment operation for the threshold, setting operation of the sensor unit or operation mode, or any combination thereof; and
a control unit configured to control the dot-matrix display unit, wherein the control unit is configured to cause the dot-matrix display unit to display the threshold in a first display region of the dot-matrix display unit, cause the dot-matrix display unit to display the physical quantity in a second region of the dot-matrix display unit, reduce an area of the first display region when information representing an operation mode of the sensor unit and different from the physical quantity and different from the threshold is displayed together with the physical quantity and the threshold, and cause the dot-matrix display unit to display the information in a third display region obtained by reducing the area of the first display region, and the control unit is configured to cause the dot-matrix display unit to switch from the first display form to the second display form upon receiving the user input when the first display form is displayed on the dot-matrix display unit and switch from the second display form back to the first display form without receiving the user input after a predetermined time elapses when the second display form is displayed on the dot-matrix display unit.

\* \* \* \* \*